(12) United States Patent
Jeon et al.

(10) Patent No.: US 12,369,457 B2
(45) Date of Patent: Jul. 22, 2025

(54) DISPLAY PANEL AND DISPLAY APPARATUS INCLUDING THE DISPLAY PANEL

(71) Applicant: Samsung Display Co., Ltd., Yongin-Si (KR)

(72) Inventors: Yongje Jeon, Yongin-si (KR); Chunseok Ko, Yongin-si (KR); Kihong Kim, Yongin-si (KR); Sangkyung Kim, Yongin-si (KR); Jaeyoung Oh, Yongin-si (KR); Sungwoo Lee, Yongin-si (KR); Kyeongsik Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 589 days.

(21) Appl. No.: 17/583,393

(22) Filed: Jan. 25, 2022

(65) Prior Publication Data

US 2023/0022216 A1   Jan. 26, 2023

(51) Int. Cl.
*H01L 27/32* (2006.01)
*H10K 59/121* (2023.01)
*H10K 59/122* (2023.01)
*H10K 59/131* (2023.01)

(52) U.S. Cl.
CPC ....... *H10K 59/122* (2023.02); *H10K 59/1213* (2023.02); *H10K 59/131* (2023.02)

(58) Field of Classification Search
CPC ......... H10K 59/122; H10K 59/10–221; H10K 59/35; H10K 59/173; H10K 59/121–1216; H10K 59/65; H10K 50/11; H10K 50/00; H10K 59/10221
See application file for complete search history.

(56) References Cited

U.S. PATENT DOCUMENTS

| | | | |
|---|---|---|---|
| 8,530,910 B2 | 9/2013 | Song et al. | |
| 10,700,052 B2 | 6/2020 | Ninan et al. | |
| 2020/0152832 A1 | 5/2020 | Yoon et al. | |
| 2020/0411606 A1* | 12/2020 | Kim | H10K 59/805 |
| 2021/0405260 A1* | 12/2021 | He | G02B 1/10 |
| 2023/0032526 A1* | 2/2023 | Shi | H10K 59/65 |
| 2023/0075241 A1* | 3/2023 | Xin | H10K 59/121 |
| 2023/0157116 A1* | 5/2023 | Liu | H10K 59/122 |
| | | | 257/40 |
| 2023/0337499 A1* | 10/2023 | Fang | G09F 9/33 |

FOREIGN PATENT DOCUMENTS

| | | |
|---|---|---|
| CN | 111681560 A | 9/2020 |
| CN | 111725285 A | 9/2020 |
| KR | 10-2020-0056213 A | 5/2020 |

* cited by examiner

*Primary Examiner* — Shahed Ahmed
*Assistant Examiner* — Rhys Poniente Sheker
(74) *Attorney, Agent, or Firm* — Innovation Counsel LLP

(57) ABSTRACT

A display panel includes: a substrate including a first display area and a second display area including a transmission area; a plurality of first display elements arranged in the first display area; a plurality of second display elements arranged in the second display area, the plurality of second display elements each including a pixel electrode and an emission layer; and a pixel defining layer defining an emission area by an opening exposing a central portion of the pixel electrode of each of the plurality of second display elements. In at least one of the plurality of second display elements, a first center of the emission layer and a second center of the emission area do not coincide with each other in a plan view.

17 Claims, 17 Drawing Sheets

DISPLAY PANEL AND DISPLAY APPARATUS INCLUDING THE DISPLAY PANEL

CROSS-REFERENCE TO RELATED APPLICATION

This application is based on and claims priority under 35 U.S.C. § 119 to Korean Patent Application No. 10-2021-0096704, filed on Jul. 22, 2021, in the Korean Intellectual Property Office, the disclosure of which is incorporated by reference herein in its entirety.

BACKGROUND

1. Field

One or more embodiments relate to a display panel and a display apparatus including the display panel, and more particularly, to a display panel having an expanded display area enabling images to be displayed even in an area in which a component that is an electronic element is arranged, and a display apparatus including the display panel.

2. Description of the Related Art

Recently, the usage of display apparatuses has diversified. Also, display apparatuses have become thinner and more lightweight, and thus, the use of display apparatuses has been expanded.

As display apparatuses are used in various ways, various methods may be used to design the shapes of the display apparatuses. In addition, the number of functions that may be added or linked to display apparatuses is increasing.

SUMMARY

One or more embodiments include a display panel having an expanded display area enabling images to be displayed even in an area in which a component that is an electronic element is arranged, and a display apparatus including the display panel. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate including a first display area and a second display area including a transmission area, a plurality of first display elements arranged in the first display area, a plurality of second display elements arranged in the second display area, the plurality of second display elements each including a pixel electrode and an emission layer, and a pixel defining layer defining an emission area by an opening exposing a central portion of the pixel electrode of each of the plurality of second display elements, wherein, in at least one of the plurality of second display elements, a first center of the emission layer and a second center of the emission area do not coincide with each other in a plan view.

In some embodiments, emission areas of the plurality of first display elements may be regularly arranged, and the emission areas of the plurality of second display elements may be irregularly arranged.

In some embodiments, the emission layer may have a portion that does not overlap the pixel electrode in a plan view.

In some embodiments, the plurality of second display elements may include at least two selected from a $(2\text{-}1)^{th}$ display element in which the first center and the second center are horizontally shifted in a plan view, a $(2\text{-}2)^{th}$ display element in which the first center and the second center are vertically shifted in a plan view, a $(2\text{-}3)^{th}$ display element in which the first center and the second center are diagonally shifted in a plan view, and a $(2\text{-}4)^{th}$ display element in which the first center and the second center coincide with each other in a plan view.

In some embodiments, the $(2\text{-}1)^{th}$ display element, the $(2\text{-}2)^{th}$ display element, the $(2\text{-}3)^{th}$ display element, and the $(2\text{-}4)^{th}$ display element may be randomly arranged.

In some embodiments, the plurality of second display elements may include a $(2\text{-}1)^{th}$ display element and a $(2\text{-}2)^{th}$ display element that emit a same color, and a size of an emission area of the $(2\text{-}1)^{th}$ display element may be different from a size of an emission area of the $(2\text{-}2)^{th}$ display element.

In some embodiments, the plurality of second display elements may include a $(2\text{-}1)^{th}$ display element and a $(2\text{-}2)^{th}$ display element that have different shapes from each other.

In some embodiments, the $(2\text{-}1)^{th}$ display element and the $(2\text{-}2)^{th}$ display element have elliptical shapes having different eccentricities from each other.

In some embodiments, the plurality of second display elements may include a $(2\text{-}1)^{th}$ display element and a $(2\text{-}2)^{th}$ display element that have different sizes from each other.

In some embodiments, a center of an emission layer and a center of an emission area in each of the plurality of first display elements may coincide with each other in a plan view.

According to one or more embodiments, a display apparatus includes a display panel including a first display area and a second display area in which a transmission area is arranged, and a component disposed below the display panel and overlapping the second display area, wherein the display panel includes a substrate, a plurality of first display elements arranged in the first display area, a plurality of second display elements arranged in the second display area, the plurality of second display elements each including a pixel electrode and an emission layer, and a pixel defining layer defining an emission area by an opening exposing a central portion of the pixel electrode of each of the plurality of second display elements, and, in at least one of the plurality of second display elements, a first center that is a center of the emission area and a second center that is a center of the emission layer do not coincide with each other in a plan view.

In some embodiments, emission areas of the plurality of first display elements may be regularly arranged and emission areas of the plurality of second display elements may be irregularly arranged.

In some embodiments, the emission layer may have a portion that does not overlap the pixel electrode in a plan view.

In some embodiments, the plurality of second display elements may include at least two selected from a $(2\text{-}1)^{th}$ display element in which the first center and the second center are horizontally shifted in a plan view, a $(2\text{-}2)^{th}$ display element in which the first center and the second center are vertically shifted in a plan view, a $(2\text{-}3)^{th}$ display element in which the first center and the second center are diagonally shifted in a plan view, and a $(2\text{-}4)^{th}$ display element in which the first center and the second center coincide with each other in a plan view.

In some embodiments, the $(2\text{-}1)^{th}$ display element, the $(2\text{-}2)^{th}$ display element, the $(2\text{-}3)^{th}$ display element, and the $(2\text{-}4)^{th}$ display element may be randomly arranged.

In some embodiments, the plurality of second display elements may include a $(2\text{-}1)^{th}$ display element and a $(2\text{-}2)^{th}$ display element that emit a same color, and a size of an emission area of the $(2\text{-}1)^{th}$ display element may be different from a size of an emission area of the $(2\text{-}2)^{th}$ display element.

In some embodiments, the plurality of second display elements may include a $(2\text{-}1)^{th}$ display element and a $(2\text{-}2)^{th}$ display element that have different shapes from each other.

In some embodiments, the $(2\text{-}1)^{th}$ display element and the $(2\text{-}2)^{th}$ display element may have elliptical shapes having different eccentricities from each other.

In some embodiments, the plurality of second display elements may include a $(2\text{-}1)^{th}$ display element and a $(2\text{-}2)^{th}$ display element that have different sizes and shapes from each other.

In some embodiments, a center of an emission layer and a center of an emission area in each of the plurality of first display elements may coincide with each other in a plan view.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
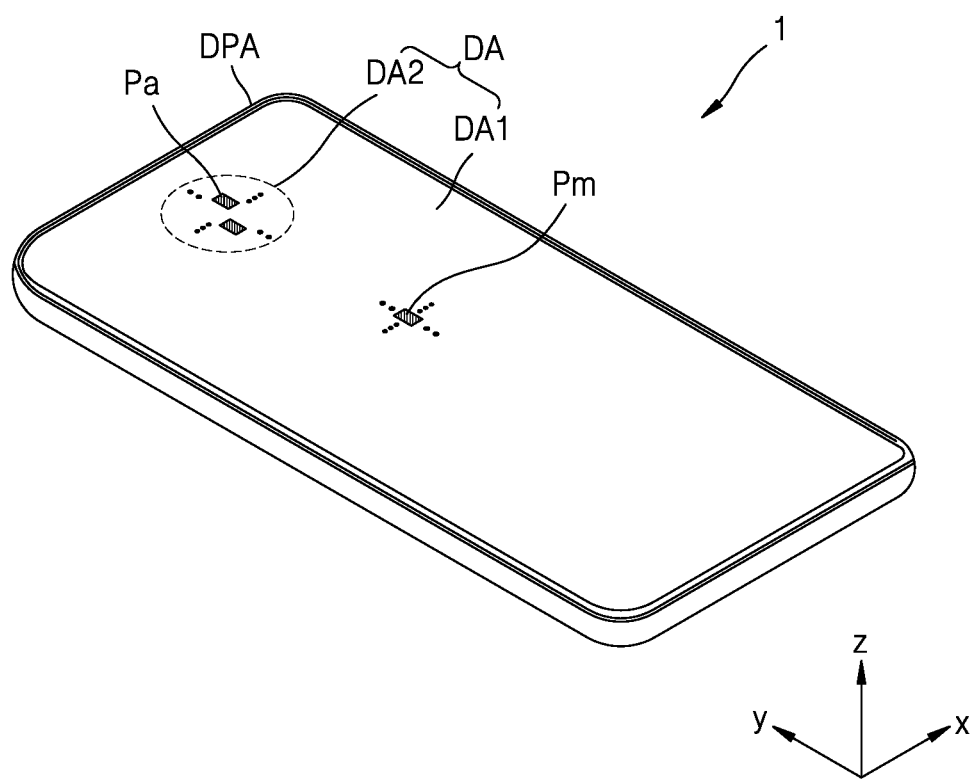
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals and redundant descriptions thereof are omitted.

It will be further understood that, when a layer, region, or element is referred to as being "on" another layer, region, or element, it can be directly or indirectly on the other layer, region, or element. That is, for example, intervening layers, regions, or elements may be present. Also, sizes of elements in the drawings may be exaggerated or reduced for convenience of explanation. For example, because sizes and thicknesses of elements in the drawings are arbitrarily illustrated for convenience of explanation, the disclosure is not limited thereto.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a perspective view schematically illustrating a display apparatus 1 according to an embodiment.

Referring to FIG. 1, the display apparatus 1 includes a display area DA and a peripheral area DPA outside the display area DA. The display area DA may include a first display area DA1 and a second display area DA2. The first display area DA1 may be arranged to surround at least a portion of the second display area DA2. The first display area DA1 may be a main display area and the second display area DA2 may be a component area in which a component is arranged. The second display area DA2 may be an auxiliary display area. That is, the first display area DA1 and the second display area DA2 may display an image individually or together. The peripheral area DPA may be a type of non-display area in which display elements are not arranged. The display area DA may be completely surrounded by the peripheral area DPA.

FIG. 1 illustrates that one second display area DA2 is disposed inside the first display area DA1. In another embodiment, the display apparatus 1 may have two or more second display areas DA2, and the shapes and sizes of the two or more second display areas DA2 may be different from each other. When viewed from a direction substantially perpendicular to the upper surface of the display apparatus 1, the second display area DA2 may have various shapes, for example, a circular shape, an elliptical shape, a polygonal shape such as a rectangular shape, a star shape, or a diamond shape.

Although FIG. 1 illustrates that the second display area DA2 is arranged at the upper center (+y direction) of the first display area DA1 substantially having a rectangular shape, when viewed from a direction perpendicular to the upper surface of the display apparatus 1, the second display area DA2 may be arranged on one side of the first display area DA1 having the rectangular shape, for example, on the upper right side or the upper left side thereof.

The display apparatus 1 may provide an image through a plurality of pixels. The pixel may include sub-pixels capable of displaying red, green, and blue colors. The pixel may include a set of a plurality of sub-pixels.

The sub-pixel may include an emission area of one display element. The display element may include a pixel electrode (anode), an opposite electrode (cathode), and an emission layer disposed between the pixel electrode and the opposite electrode, and the emission area may be defined as an area in which the emission layer emits light. In an embodiment, the emission area may be defined as an opening area of a pixel defining layer that covers edges of the pixel electrode and exposes the central portion thereof. Similarly, the emission area may be defined as the opening area of the pixel defining layer.

The emission layer may include an organic material capable of substantially displaying red, green, and blue colors. The emission layer may include an emission area in which light is actually emitted and a non-emission area in which light is not emitted. The non-emission area may be an area of the emission layer covered by the pixel defining layer.

In this specification, the pixel may be used in the same concept as the sub-pixel. That is, the pixel may be implemented as the emission area of one display element. In some cases, the pixel or the sub-pixel may be used in the same concept as the display element.

Images may be provided by using a plurality of first pixels Pm in the first display area DA1 and a plurality of second pixels Pa in the second display area DA2.

The second pixels Pa may be arranged in the second display area DA2. The second pixels Pa may emit light to provide a certain image. An image displayed in the second display area DA2 is an auxiliary image and may have a resolution lower than that of an image displayed in the first display area DAL In the second display area DA2, a component 40 (see FIG. 2) that is an electronic element may be disposed below a display panel. The component 40 is a camera using infrared light or visible light, and may include an imaging element. Alternatively, the component 40 may be a solar cell, a flash, an illumination sensor, a proximity sensor, or an iris sensor. Alternatively, the component 40 may have a sound receiving function. In order to minimize the limitation in the function of the component 40, a second pixel circuit configured to drive the second pixel Pa in the second display area DA2 may not be disposed in the second display area DA2 and may be in another area outside the second display area DA2. For example, the second pixel circuit may be disposed in the peripheral area DPA adjacent to the second display area DA2. In another embodiment, the second pixel circuit may be disposed between the first display area DA1 and the second display area DA2 and may be configured to provide an image.

In the case of the display panel and the display apparatus including the same, according to embodiments, when light is transmitted through the second display area DA2, the transmittance is about 10% or more, and more specifically, about 25% more, about 40% or more, about 50% or more, about 85% or more, or about 90% or more.

Figure 2:
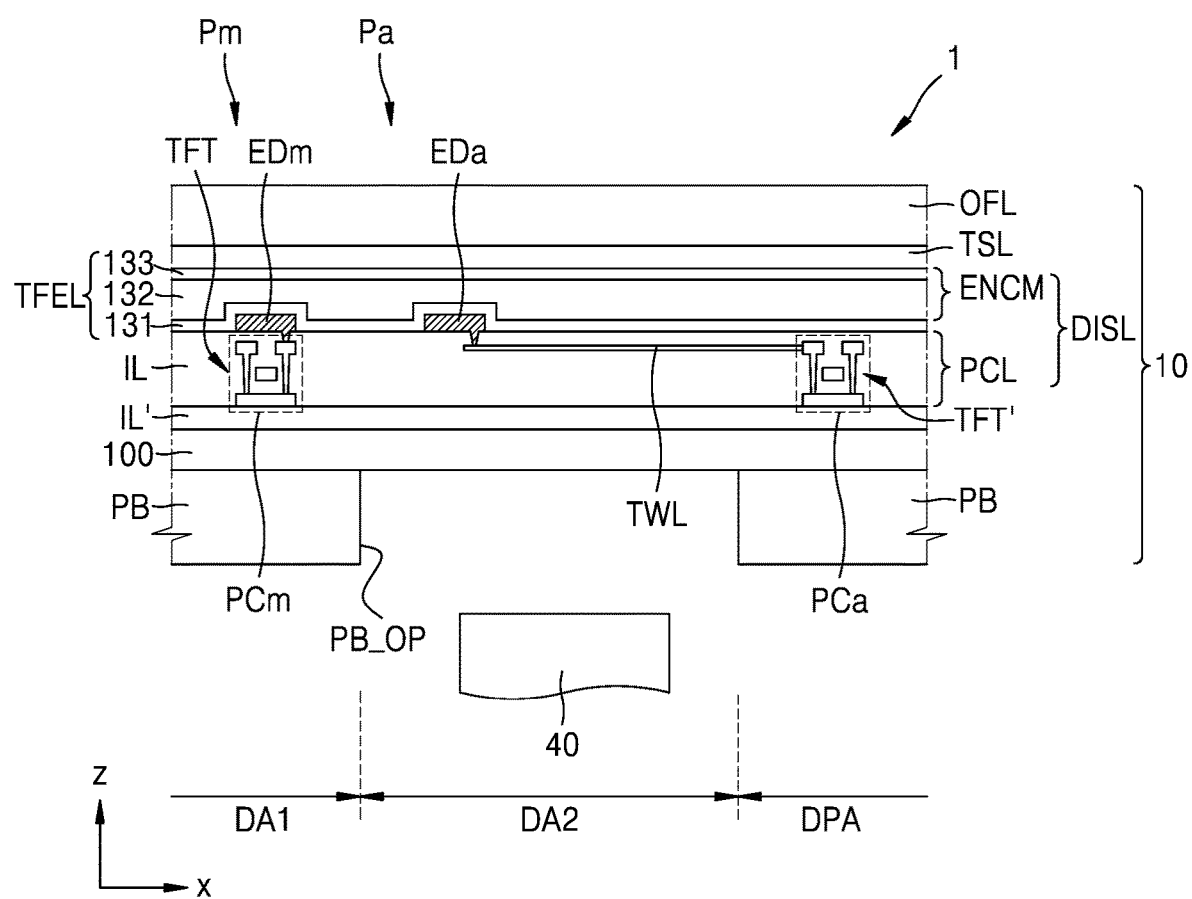
FIG. 2 is a cross-sectional view schematically illustrating a portion of a display apparatus, according to an embodiment.

FIG. 2 is a cross-sectional view schematically illustrating a portion of a display apparatus 1 according to an embodiment.

Referring to FIG. 2, the display apparatus 1 may include a display panel 10 and a component 40 overlapping the display panel 10 in a plan view. A cover window (not illustrated) that protects the display panel 10 may be further disposed on the display panel 10.

The display panel 10 includes a second display area DA2 overlapping the component 40 in a plan view and a first display area DA1 in which a main image is displayed. The display panel 10 may include a substrate 100, a display layer DISL, a touch screen layer TSL, an optical function layer OFL disposed above the substrate 100, and a panel protection layer PB disposed below the substrate 100.

The display layer DISL may include a circuit layer PCL including thin-film transistors TFT and TFT', a display element layer including light-emitting elements EDm and EDa that are display elements, and an encapsulation layer ENCM such as a thin-film encapsulation layer TFEL or an encapsulation substrate (not illustrated). Insulating layers IL and IL' may be disposed between the substrate 100 and the display layer DISL and inside the display layer DISL.

The substrate 100 may include an insulating material such as glass, quartz, or polymer resin. The substrate 100 may include a rigid substrate or a flexible substrate, for example, a bendable, foldable, or rollable substrate.

A first pixel circuit PCm and a first display element EDm connected thereto may be arranged in the first display area DA1 of the display panel 10. The first pixel circuit PCm may include at least one thin-film transistor TFT and may control light emission of the first display element EDm. The first pixel Pm may display an image by light emission of the first display element EDm.

A second display element EDa may be arranged in the second display area DA2 of the display panel 10 to display an image. The second display area DA2 is an auxiliary display area and the resolution of the second display area DA2 may be less than the resolution of the first display area DA1. That is, the number of second display elements EDa per unit area in the second display area DA2 may be less than the number of first display elements EDm per unit area in the first display area DAL In the present embodiment, a second pixel circuit PCa configured to drive the second display element EDa may not be arranged in the second display area DA2, but may be arranged in the peripheral area DPA. As another embodiment, a location of the second pixel circuit PCa may be variously modified. For example, the second pixel circuit PCa may be arranged in a third display area disposed between the first display area DA1 and the second display area DA2. That is, the second pixel circuit PCa may be arranged so as not to overlap the second display element EDa.

The second pixel circuit PCa may include at least one thin-film transistor TFT' and may be electrically connected to the second display element EDa by a connection line TWL. The connection line TWL may include a metal or a transparent conductive material. The second pixel circuit PCa may control light emission of the second display element EDa. The second pixel Pa may display an image by light emission of the second display element EDa.

Also, the second display area DA2 may include a transmission area through which light/signal emitted from the component 40 or light/signal incident on the component 40 is transmitted. In the second display area DA2, the transmission area may be an area in which the pixel electrode (anode) of the second display element EDa is not arranged. The transmission area may be an area other than the area in which the second display element EDa emits light. The transmission area may include an area disposed between the second pixels Pa. The transmission area may include an area disposed between the second display elements EDa.

An inorganic insulating layer, such as a buffer layer or a gate insulating layer which may be included in the insulating layers IL and IL', may be arranged in the transmission area. An organic insulating layer, which may be included in the insulating layers IL and IL', may be arranged in the transmission area. An opposite electrode (cathode) may be arranged in the transmission area. An inorganic encapsulation layer and/or an organic encapsulation layer of the thin-film encapsulation layer TFEL may be arranged in the transmission area. A conductive line including a metal and/or a transparent conductive material may be arranged in the transmission area. The substrate 100, a polarizing plate, an adhesive, a window, and the panel protection layer PB may be arranged in the transmission area.

Because the number of second display elements EDa per area in the second display area DA2 is less than the number of first display elements EDm per area in the first display area DA1, the transmittance of the second display area DA2 may be high.

The first display element EDm and the second display element EDa, which are display elements, may be covered with the thin-film encapsulation layer TFEL or the encapsulation substrate. In some embodiments, the thin-film encapsulation layer TFEL may include at least one inorganic encapsulation layer and at least one organic encapsulation layer, as illustrated in FIG. 2. In an embodiment, the thin-film encapsulation layer TFEL may include first and second inorganic encapsulation layers 131 and 133, and an organic encapsulation layer 132 disposed between the first inorganic encapsulation layers 131 and the second inorganic encapsulation layers 133.

The first inorganic encapsulation layer 131 and the second inorganic encapsulation layer 133 may include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$), and may be formed by chemical vapor deposition (CVD) or the like. The organic encapsulation layer 132 may include a polymer-based material. The polymer-based material may include a silicone-based resin, an acrylic resin, an epoxy-based resin, polyimide, and polyethylene.

The first inorganic encapsulation layer 131, the organic encapsulation layer 132, and the second inorganic encapsulation layer 133 may be provided as one body to cover the first display area DA1 and the second display area DA2.

When the first display element EDm and the second display element EDa, which are display elements, are sealed with an encapsulation substrate (not illustrated), the encapsulation substrate may be arranged to face the substrate 100 with the display elements disposed therebetween. There may be a gap between the encapsulation substrate and the display element. The encapsulation substrate may include glass. A sealant including frit or the like may be disposed between the substrate 100 and the encapsulation substrate, and the sealant may be arranged in the peripheral area DPA. The sealant arranged in the peripheral area DPA may prevent infiltration of moisture through the side surface of the display apparatus 1 while surrounding the display area DA.

The touch screen layer TSL may obtain coordinate information according to an external input, for example, a touch event. The touch screen layer TSL may include a touch electrode and touch lines connected to the touch electrode. The touch screen layer TSL may sense an external input by using a self-capacitance method or a mutual capacitance method.

The touch screen layer TSL may be disposed on the thin-film encapsulation layer TFEL. Alternatively, the touch screen layer TSL may be separately formed on a touch substrate and then the touch substrate may be bonded to the thin-film encapsulation layer TFEL through an adhesive layer such as an optically clear adhesive (OCA). As an embodiment, the touch screen layer TSL may be directly formed on the thin-film encapsulation layer TFEL. In this case, the adhesive layer may not be disposed between the touch screen layer TSL and the thin-film encapsulation layer TFEL.

The optical function layer OFL may include an anti-reflective layer. The anti-reflective layer may reduce the reflectance of light (external light) incident from the outside to the display apparatus 1. In some embodiments, the optical function layer OFL may include a polarizing film. In some embodiments, the optical function layer OFL may include a filter plate including a black matrix and color filters.

The panel protection layer PB may be attached to the lower portion of the substrate 100 to support and protect the substrate 100. The panel protection layer PB may include an opening PB_OP in an area corresponding to the second display area DA2. The opening PB_OP provided in the panel protection layer PB may improve the transmittance of the second display area DA2. The panel protection layer PB may include polyethylene terephthalate (PET) or polyimide (PI). The panel protection layer PB may not include the opening PB_OP and may be continuously arranged to correspond to the second display area DA2.

The area of the second display area DA2 may be greater than the area on which the component 40 is arranged. Therefore, the area of the opening PB_OP provided in the panel protection layer PB may not match the area of the second display area DA2.

Also, a plurality of components 40 may be arranged in the second display area DA2. The components 40 may have different functions from each other. For example, the components 40 may include at least two selected from a camera (imaging element), a solar cell, a flash, a proximity sensor, an illumination sensor, and an iris sensor.

Figure 3:
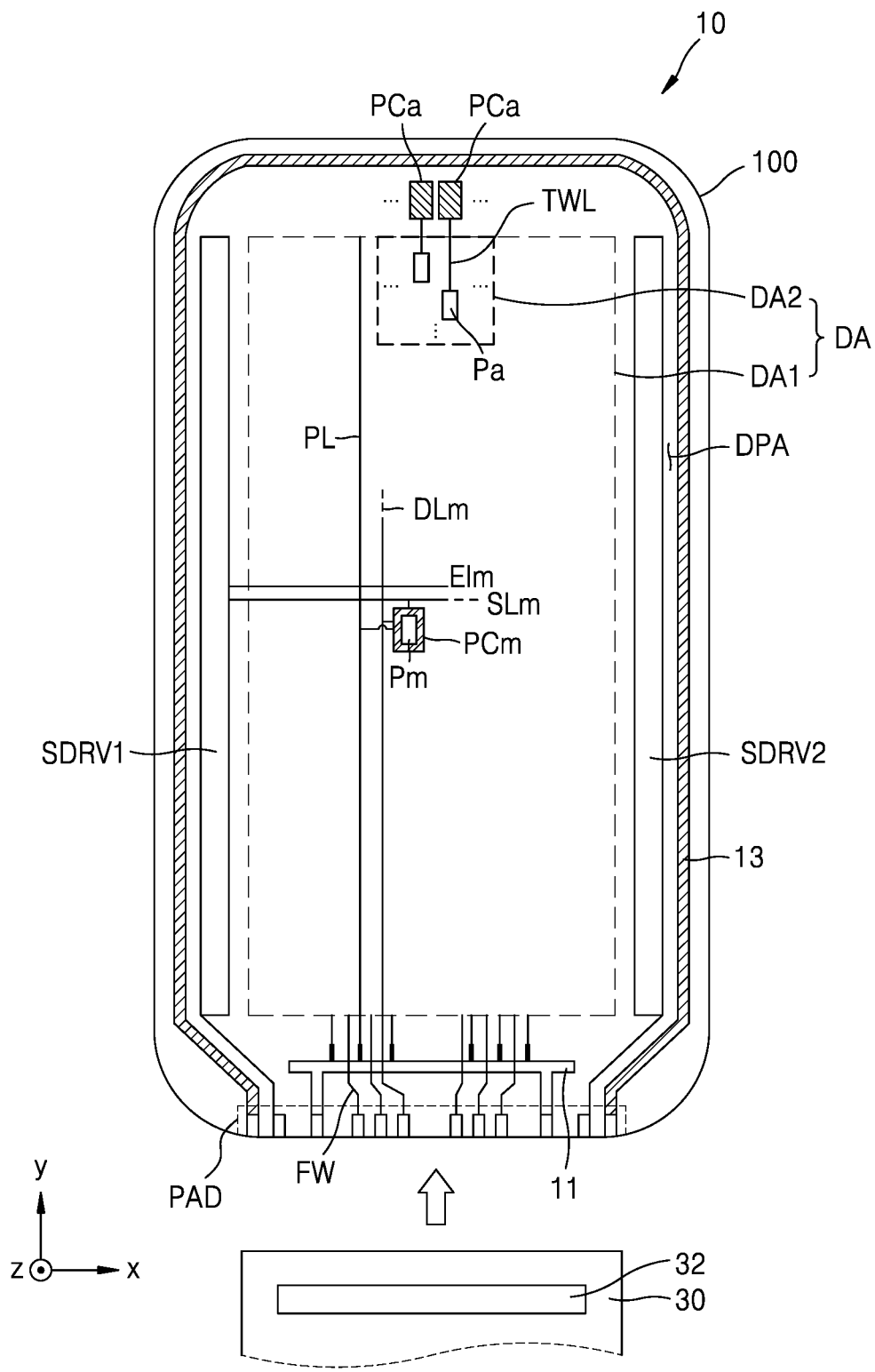
FIG. 3 is a plan view schematically illustrating a display panel in the display apparatus of FIG. 1 according to an embodiment.

FIG. 3 is a plan view schematically illustrating a display panel 10 in the display apparatus of FIG. 1 according to an embodiment.

Referring to FIG. 3, various elements constituting the display panel 10 are disposed on a substrate 100. The substrate 100 includes a display area DA and a peripheral area DPA surrounding the display area DA. The display area DA includes a first display area DA1 in which a main image is displayed and a second display area DA2 in which an auxiliary image is displayed. The auxiliary image may form one whole image together with the main image and the auxiliary image may be an image independent from the main image.

A plurality of first pixels Pm are arranged in the first display area DA1. Each of the first pixels Pm may be implemented as a display element such as an organic light-emitting diode (OLED). A first pixel circuit PCm configured to drive the first pixel Pm may be arranged in the first display area DA1 to overlap the first pixel Pm. The first pixel Pm may emit, for example, red light, green light, blue light, or white light. The first display area DA1 may be covered with an encapsulation layer and protected from ambient air or moisture.

As described above, the second display area DA2 may be disposed at one side of the first display area DA1 or inside the display area DA and surrounded by the first display area DAL A plurality of second pixels Pa are arranged in the second display area DA2. Each of the second pixels Pa may be implemented as a display element such as an OLED. A second pixel circuit PCa configured to drive the second pixel Pa may be arranged in the peripheral area DPA close to the second display area DA2. For example, when the second display area DA2 is disposed above the display area DA, the second pixel circuit PCa may be disposed in the peripheral area DPA disposed above the display area DA. The second pixel circuit PCa and the display element implementing the second pixel Pa may be connected to each other by a connection line TWL extending in the y direction. The second pixel Pa may emit, for example, red light, green light, blue light, or white light. The second display area DA2 may be covered with an encapsulation layer and protected from ambient air or moisture.

The resolution of the second display area DA2 may be about ½, ⅜, ⅓, ¼, 2/9, ⅛, ⅑, or 1/16 of the resolution of the first display area DA1. For example, the resolution of the first display area DA1 may be about 400 ppi or more, and the resolution of the second display area DA2 may be about 200 ppi or about 100 ppi.

The pixel circuits configured to drive the first and second pixels Pm and Pa may be electrically connected to external circuits arranged in the peripheral area DPA. A first scan driving circuit SDRV1, a second scan driving circuit SDRV2, a terminal part PAD, a driving voltage supply line 11, and a common voltage supply line 13 may be arranged in the peripheral area DPA.

The first scan driving circuit SDRV1 may be configured to apply a scan signal through a main scan line SLm to the first pixel circuit PCm configured to drive the first pixel Pm. The first scan driving circuit SDRV1 may be configured to apply an emission control signal to the pixel circuit through a main emission control line ELm. The second scan driving circuit SDRV2 may be disposed on the opposite side of the first scan driving circuit SDRV1 with respect to the first display area DA1, and may be disposed substantially parallel to the first scan driving circuit SDRV1. Some pixel circuits of the first pixels Pm of the first display area DA1 may be electrically connected to the first scan driving circuit SDRV1 and the others thereof may be electrically connected to the second scan driving circuit SDRV2.

The terminal part PAD may be arranged at one side of the substrate 100. The terminal part PAD is exposed without being covered with an insulating layer and is connected to a display circuit board 30. A display driver 32 may be disposed on the display circuit board 30.

The display driver 32 may be configured to generate a control signal to be transmitted to the first scan driving circuit SDRV1 and the second scan driving circuit SDRV2. The display driver 32 may be configured to generate a data signal, and the generated data signal may be transmitted to the first pixel circuits PCm through a fan-out line FW and a main data line DLm connected to the fan-out line FW.

The display driver 32 may be configured to supply a driving voltage ELVDD to a driving voltage supply line 11, and may be configured to supply a common voltage ELVSS to a common voltage supply line 13. The driving voltage ELVDD may be applied to the pixel circuits of the first and second pixels Pm and Pa through a driving voltage line PL connected to the driving voltage supply line 11, and the common voltage ELVSS may be applied to the opposite electrode of the display element through a common voltage supply line 13.

The driving voltage supply line 11 may extend from the lower side of the first display area DA1 in the x direction. The common voltage supply line 13 has a loop shape with one side open and may partially surround the first display area DA1.

Although FIG. 3 illustrates a case in which one second display area DA2 is provided, a plurality of second display areas DA2 may be provided. In this case, the second display areas DA2 may be disposed spaced apart from each other, a first camera may be arranged to correspond to one second display area DA2, and a second camera may be arranged to correspond to another second display area DA2. Alternatively, a camera may be arranged to correspond to one second display area DA2 and an infrared sensor may be arranged to correspond to another second display area DA2. The shapes and sizes of the second display areas DA2 may be different from each other.

Figure 4:
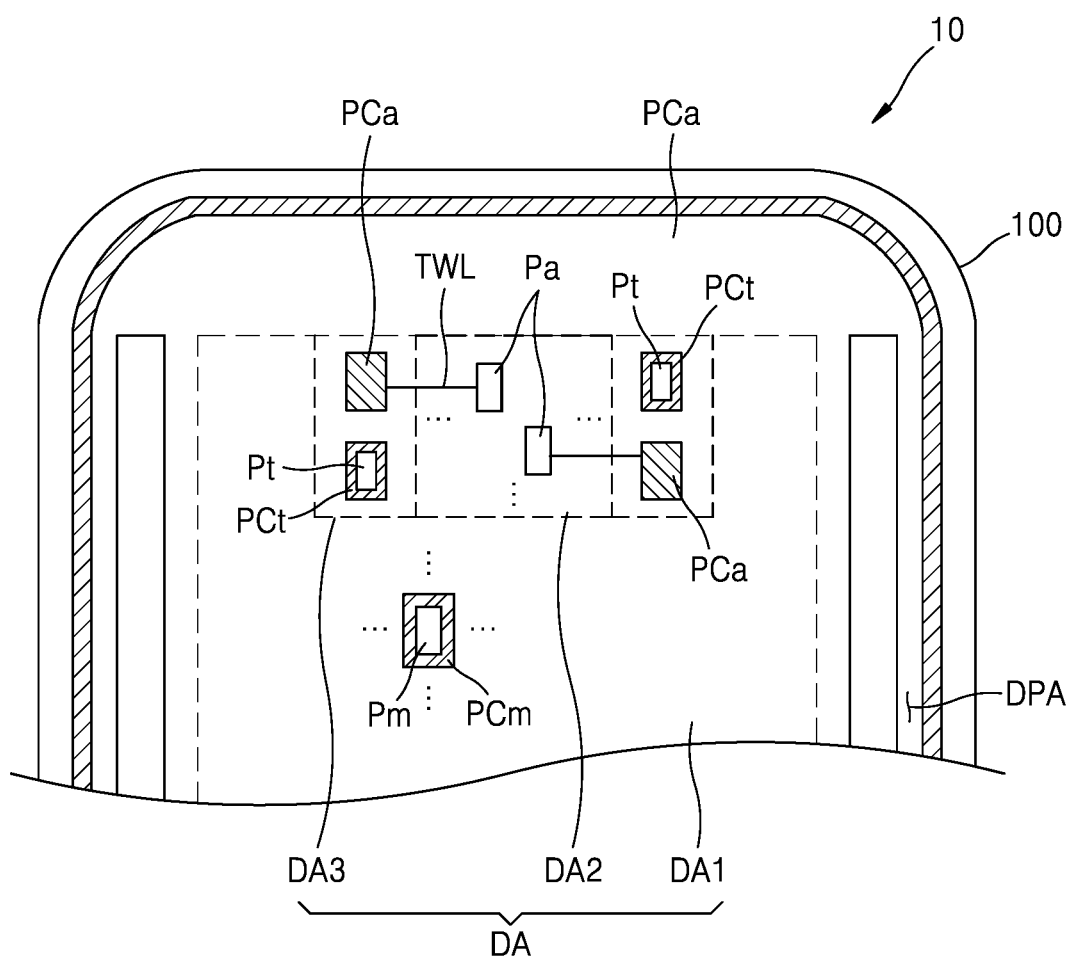
FIG. 4 is a plan view schematically illustrating a display panel in the display apparatus of FIG. 1 according to an embodiment.
Figure 5:
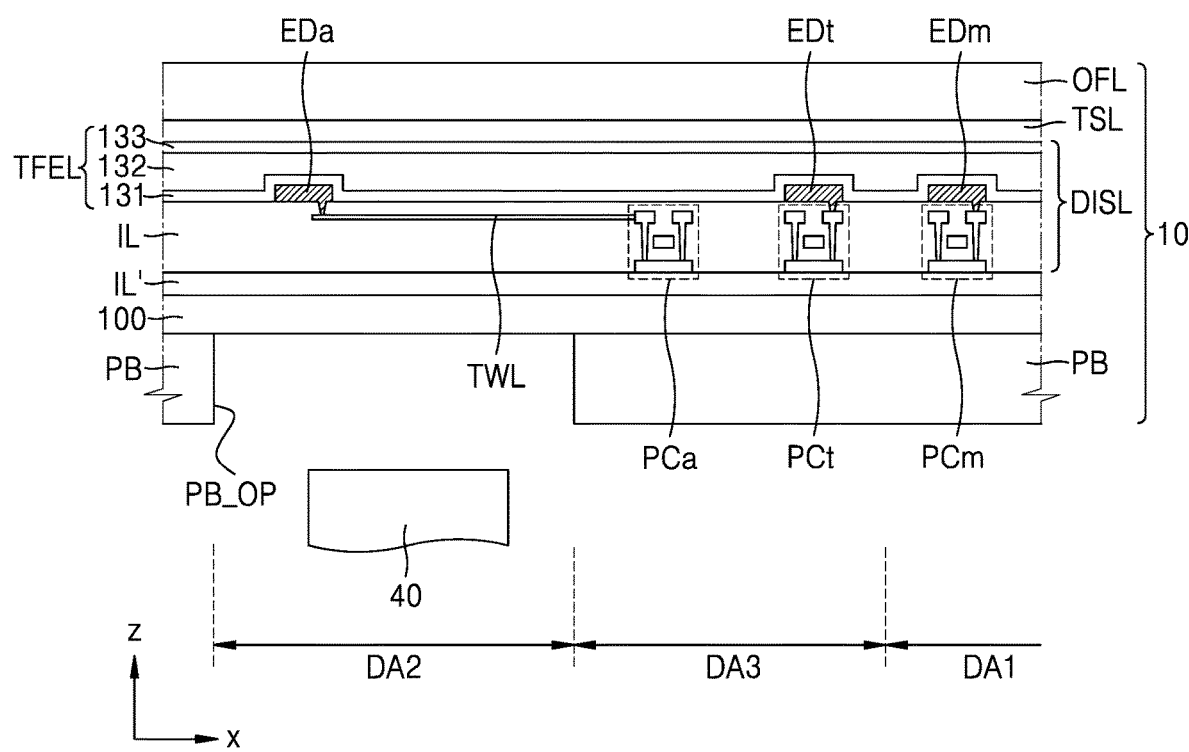
FIG. 5 is a schematic cross-sectional view of the display panel of FIG. 4 according to an embodiment.

On the other hand, the second display area DA2 may have a circular shape, an elliptical shape, a polygonal shape, or an irregular shape. In some embodiments, the second display area DA2 may have an octagonal shape. The second display area DA2 may have various polygonal shapes, for example, a rectangular shape or a hexagonal shape. The second display area DA2 may be surrounded by the first display area DAL FIG. 4 is a plan view schematically illustrating a display panel 10 in the display apparatus of FIG. 1 according to an embodiment. FIG. 5 is a schematic cross-sectional view of the display panel 10 of FIG. 4. In FIGS. 4 and 5, the same reference numerals as those in FIGS. 2 and 3 denote the same members, and redundant descriptions thereof are omitted.

Referring to FIGS. 4 and 5, a display area DA of a substrate 100 includes a first display area DA1, a second display area DA2, and a third display area DA3 disposed between the first display area DA1 and the second display area DA2.

The first display area DA1 may be an area in which a main image is displayed. The second display area DA2 and the third display area DA3 may be areas in which an auxiliary image is displayed. The auxiliary image may form one whole image together with the main image and the auxiliary image may be an image independent from the main image.

The third display area DA3 may be arranged on at least one side of the second display area DA2. Although FIG. 4 illustrates that the third display area DA3 is disposed on the left side and the right side of the second display area DA2, the disclosure is not limited thereto. The location of the third display area DA3 may be variously modified. For example, the third display area DA3 may be disposed above and below the second display area DA2, or may be arranged to surround the second display area DA2.

A plurality of third pixels Pt are arranged in the third display area DA3. Each of the third pixels Pt may be implemented as a display element such as an OLED. A third pixel circuit PCt configured to drive the third pixel Pt may be arranged in the third display area DA3, and the third pixel circuit PCt may be arranged to overlap the third pixel Pt. The third pixel Pt may emit, for example, red light, green light, blue light, or white light. The third display area DA3 may be covered with an encapsulation layer and protected from ambient air or moisture.

A second pixel circuit PCa configured to drive the second pixel Pa of the second display area DA2 may be arranged in the third display area DA3. The second pixel circuit PCa and the third pixel circuit PCt may be alternately arranged in the third display area DA3. The second pixel circuit PCa and a second display element EDa implementing the second pixel Pa may be connected to each other by a connection line TWL extending in the x direction.

The resolution of the third display area DA3 may be equal to the resolution of the second display area DA2. Alternatively, the resolution of the third display area DA3 may be greater than the resolution of the second display area DA2 and less than the resolution of the first display area DA1.

For example, the resolution of the third display area DA3 may be about ½, ⅜, ⅓, ¼, 2/9, ⅛, 1/9, or 1/16 of the resolution of the first display area DA1. For example, the resolution of the first display area DA1 may be about 400 ppi or more, and the resolution of the second display area DA2 and the third display area DA3 may be about 200 ppi or about 100 ppi.

In an embodiment, the first pixel circuit PCm, the second pixel circuit PCa, and the third pixel circuit PCt may be identically provided. However, the disclosure is not limited thereto. The first pixel circuit PCm, the second pixel circuit PCa, and the third pixel circuit PCt may be variously modified. For example, the first pixel circuit PCm, the second pixel circuit PCa, and the third pixel circuit PCt may be differently provided.

Figure 6:
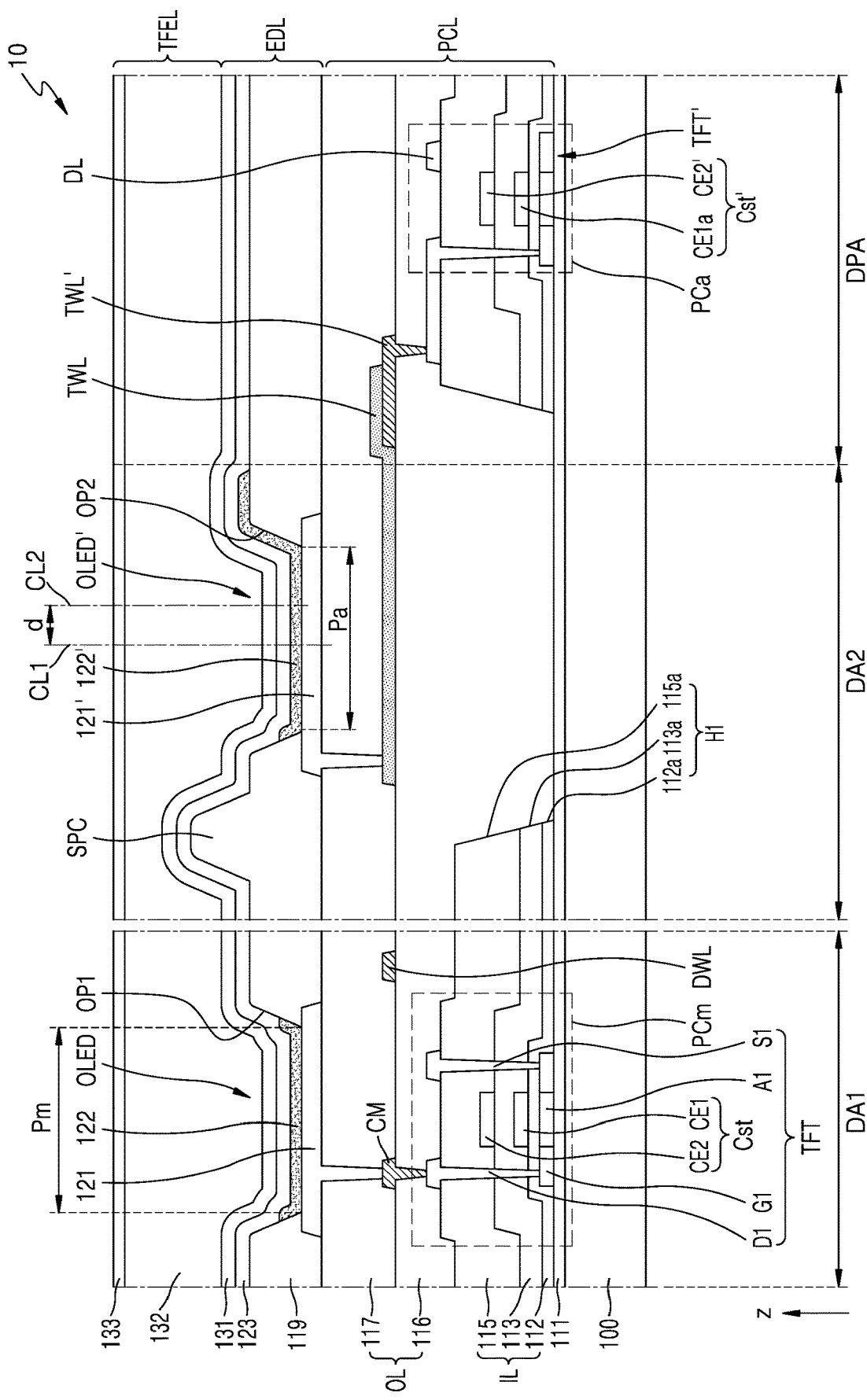
FIG. 6 is a schematic cross-sectional view illustrating a portion of a display panel according to an embodiment.

FIG. 6 is a schematic cross-sectional view illustrating a portion of a display panel 10 according to an embodiment, and is a cross-sectional view schematically illustrating a portion of a first display area DA1, a second display area DA2, and a peripheral area DPA.

Referring to FIG. 6, a first pixel Pm is arranged in the first display area DA1, and a second pixel Pa is arranged in the second display area DA2. A first pixel circuit PCm including a main thin-film transistor TFT and a main storage capacitor Cst, and a first organic light-emitting diode OLED as a first display element connected to the first pixel circuit PCm may be arranged in the first display area DA1. A second organic light-emitting diode OLED' as a second display element may be arranged in the second display area DA2. A second pixel circuit PCa including an auxiliary thin-film transistor TFT' and an auxiliary storage capacitor Cst' may be arranged in the peripheral area DPA. A first connection line TWL connecting the second pixel circuit PCa to the second organic light-emitting diode OLED' may be arranged in the second display area DA2 and the peripheral area DPA.

On the other hand, in the present embodiment, an example in which the organic light-emitting diode is employed as the display element has been described, but in another embodiment, an inorganic light-emitting element or a quantum dot light-emitting element may be employed as the display element.

Hereinafter, a structure of the display panel 10 will be described. In the display panel 10, a substrate 100, a buffer layer 111, a circuit layer PCL, a display element layer EDL and the thin-film encapsulation layer TFEL may be stacked.

The substrate 100 may include an insulating material such as glass, quartz, or polymer resin. The substrate 100 may include a rigid substrate or a flexible substrate, for example, a bendable, foldable, or rollable substrate.

The buffer layer 111 may be disposed on the substrate 100 and may reduce or prevent infiltration of foreign material, moisture, or ambient air from below the substrate 100 and provide a flat surface on the substrate 100. The buffer layer 111 may include an inorganic material such as an oxide or a nitride, an organic material, or an organic/inorganic composite material, and may have a single-layer structure or a multilayer structure including an inorganic material and an organic material. A barrier layer (not illustrated) that prevents infiltration of ambient air may be further included between the substrate 100 and the buffer layer 111. In some embodiments, the buffer layer 111 may include silicon oxide ($SiO_2$) or silicon nitride ($SiN_x$).

The circuit layer PCL may be disposed on the buffer layer 111 and may include first and second pixel circuits PCm and PCa, a first gate insulating layer 112, a first interlayer insulating layer 113, s second interlayer insulating layer 115, a first organic insulating layer 116, and a second organic insulating layer 117. The first pixel circuit PCm may include a main thin-film transistor TFT and a main storage capacitor Cst, and the second pixel circuit PCa may include an auxiliary thin-film transistor TFT' and an auxiliary storage capacitor Cst'.

The main thin-film transistor TFT and the auxiliary thin-film transistor TFT' may be disposed on the buffer layer 111. The main thin-film transistor TFT includes a first semiconductor layer A1, a first gate electrode G1, a first source electrode S1, and a first drain electrode D1. The main thin-film transistor TFT may be connected to the first organic light-emitting diode OLED and configured to drive the first organic light-emitting diode OLED. The auxiliary thin-film transistor TFT' may be connected to a second organic light-emitting diode OLED' and configured to drive the second organic light-emitting diode OLED'. Because the auxiliary thin-film transistor TFT' has a configuration similar to that of the main thin-film transistor TFT, the description of the main thin-film transistor TFT is equally applied to the description of the auxiliary thin-film transistor TFT'.

The first semiconductor layer A1 may be disposed on the buffer layer 111 and may include polysilicon. In another embodiment, the first semiconductor layer A1 may include amorphous silicon. For example, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, and a source region and a drain region doped with impurities.

The first gate insulating layer 112 may cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The first gate insulating layer 112 may include a single layer or multiple layers including the above-described inorganic insulating material.

The first gate electrode G1 is disposed on the first gate insulating layer 112 and arranged to overlap the first semiconductor layer A1. The first gate electrode G1 may include molybdenum (Mo), aluminum (Al), copper (Cu), titanium (Ti), and the like, and may include a single layer or multiple layers. For example, the first gate electrode G1 may include a single Mo layer.

The first interlayer insulating layer 113 may cover the first gate electrode G1. The first interlayer insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The first interlayer insulating layer 113 may include a single layer or multiple layers including the above-described inorganic insulating material.

An upper electrode CE2 of the main storage capacitor Cst and an upper electrode CE2' of the auxiliary storage capacitor Cst' may be disposed on the first interlayer insulating layer 113.

In the first display area DA1, the upper electrode CE2 of the main storage capacitor Cst may overlap the first gate electrode G1 disposed therebelow. The first gate electrode G1 and the upper electrode CE2, which overlap each other with the first interlayer insulating layer 113 disposed therebetween, may constitute the main storage capacitor Cst. The first gate electrode G1 may be a lower electrode CE1 of the main storage capacitor Cst.

In the peripheral area DPA, the upper electrode CE2' of the auxiliary storage capacitor Cst' may overlap a gate electrode of the auxiliary thin-film transistor TFT' disposed therebelow. The gate electrode of the auxiliary thin-film transistor TFT' may be a lower electrode CE1a of the auxiliary storage capacitor Cst'.

The upper electrodes CE2 and CE2' may include aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and/or copper (Cu), and may include a single layer or multiple layers including the above-described material.

The second interlayer insulating layer 115 may cover the upper electrodes CE2 and CE2'. The second interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The second interlayer insulating layer 115 may include a single layer or multiple layers including the above-described inorganic insulating material.

The source electrode S1 and the drain electrode D1 may be disposed on the second interlayer insulating layer 115. The source electrode S1 and the drain electrode D1 may include a conductive material including molybdenum (Mo), aluminum (Al), copper (Cu), titanium (Ti), and the like, and may include a single layer or multiple layers including the above-described material. For example, the source electrode S1 and the drain electrode D1 may have a multilayer structure of Ti/Al/Ti.

An inorganic insulating layer IL of the display panel 10 may have an opening H1 corresponding to the second display area DA2. For example, when the first gate insulating layer 112, the first interlayer insulating layer 113, and the second interlayer insulating layer 115 are collectively referred to as the inorganic insulating layer IL, the inorganic insulating layer IL may have the opening H1 in an area corresponding to the second display area DA2. The opening H1 may expose a portion of the upper surface of the buffer layer 111 or the substrate 100. The opening H1 may include an opening 112a of the first gate insulating layer 112, an opening 113a of the first interlayer insulating layer 113, and an opening 115a of the second interlayer insulating layer 115, which are formed in the area correspond to the second display area DA2. The openings 112a, 113a, and 115a may be formed separately through separate processes, or may be formed simultaneously through the same process. The opening H1 of the inorganic insulating layer IL may be filled with the first organic insulating layer 116.

The first organic insulating layer 116 may cover the source electrodes S1 and S2 and the drain electrodes D1 and D2 of the first display area DA1 and the peripheral area DPA, and the opening H1 of the inorganic insulating layer IL may be filled with the first organic insulating layer 116 in the second display area DA2.

The first organic insulating layer 116 may include a general-purpose polymer (e.g., photosensitive polyimide, polyimide, polycarbonate (PC), benzocyclobutene (BCB), hexamethyldisiloxane (HMDSO), polymethylmethacrylate (PMMA), polystyrene (PS), etc.), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

The first organic insulating layer 116 may have a refractive index n1 of about 1.4 to about 1.6 with respect to a wavelength of 550 nm. A connection electrode CM and various lines, for example, a data line DL, may be disposed on the first organic insulating layer 116 which may be advantageous for high integration.

On the other hand, the first connection line TWL may be disposed on the first organic insulating layer 116 in the second display area DA2. The first connection line TWL may extend from the peripheral area DPA to the second display area DA2, and may connect the second organic light-emitting diode OLED' to the second pixel circuit PCa.

The first connection line TWL may be connected to a second connection line TWL'. The second connection line TWL' may be arranged in the peripheral area DPA and connected to the second pixel circuit PCa, for example, the auxiliary thin-film transistor TFT'. The first connection line TWL may be arranged in the transmission area TA of the second display area DA2. An end of the first connection line TWL may be provided to cover an end of the second connection line TWL'.

The second connection line TWL' may include a conductive material including molybdenum (Mo), aluminum (Al), copper (Cu), titanium (Ti), and the like, and may include a single layer or multiple layers including the above-described material. In some embodiments, the second connection line TWL' may be disposed on the same layer as the connection electrode CM and may include the same material as that of the connection electrode CM. In some embodiments, the second connection line TWL' may be disposed on the same layer as the data line DL and may include the same material as that of the data line DL. However, the disclosure is not limited thereto. The second connection line TWL' may be disposed on various layers. For example, the second connection line TWL' may be disposed on the same layer as the first pixel electrode 121.

The first connection line TWL may include a transparent conductive material. For example, the first connection line TWL may include a transparent conducting oxide (TCO). The first connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The second connection line TWL' may have a conductivity higher than that of the first connection line TWL.

Because the second connection line TWL' is arranged in the peripheral area DPA, it is unnecessary to secure transmittance. Therefore, the second connection line TWL' may include a material having a transmittance lower than that of the first connection line TWL but having a conductivity higher than that of the first connection line TWL. However, the disclosure is not limited thereto. In some embodiments, the first connection line TWL may include a metal, and the conductivity of the first connection line TWL may be equal to the conductivity of the second connection line TWL'.

The second organic insulating layer 117 may be disposed on the first organic insulating layer 116 and cover the first connection line TWL. The second organic insulating layer 117 may have a flat upper surface so that the first pixel electrode 121 and the second pixel electrode 121' disposed thereon are formed to be flat. The second organic insulating layer 117 may include a siloxane-based organic material having high transmittance and flatness. The siloxane-based organic material may include hexamethyldisiloxane, octamethyltrisiloxane, decamethyltetrasiloxane, dodecamethylpentasiloxane, and polydimethylsiloxane.

Alternatively, the second organic insulating layer 117 may include a general-purpose polymer (e.g., photosensitive polyimide, polyimide, benzocyclobutene (BCB), hexamethyldisiloxane (HMDSO), polymethylmethacrylate (PMMA), polystyrene (PS), etc.), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

The first and second organic light-emitting diodes OLED and OLED' are disposed on the second organic insulating layer 117. The first and second pixel electrodes 121 and 121' of the first and second organic light-emitting diodes OLED and OLED' may be respectively connected to the first and second pixel circuits PCm and PCa through the connection electrode CM disposed on the first organic insulating layer 116.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure in which layers including ITO, IZO, ZnO, or $In_2O_3$ are disposed above and/or below the reflective layer. In this case, the first pixel electrode 121 and the second pixel electrode 121' may have a stack structure of ITO/Ag/ITO.

A pixel defining layer 119 may be disposed on the second organic insulating layer 117 and the first pixel electrode 121 and the second pixel electrode 121' to cover edges of the first pixel electrode 121 and the second pixel electrode 121'. A first opening OP1 and a second opening OP2 that expose the central portions of the first pixel electrode 121 and the second pixel electrode 121', respectively, are formed in the pixel defining layer 119. The sizes and shapes of the emission area of the first and second organic light-emitting diodes OLED and OLED' are defined by the first opening OP1 and the second opening OP2.

The pixel defining layer 119 may prevent an electric arc or the like from occurring on the edges of the first and second pixel electrodes 121 and 121' by increasing distances between the edges of the first and second pixel electrodes 121 and 121' and portions of an opposite electrode 123 disposed on the first and second pixel electrodes 121 and 121'. The pixel defining layer 119 may include an organic insulating material such as polyimide, polyamide, acrylic resin, benzocyclobutene, hexamethyldisiloxane (HMDSO), and phenolic resin, and may be formed by spin coating or the like.

A spacer SPC may be disposed on the pixel defining layer 119. The spacer SPC may prevent mask dent during a mask process. The spacer SPC may include an organic insulating material such as polyimide, polyamide, acrylic resin, benzocyclobutene, hexamethyldisiloxane (HMDSO), and phenolic resin. In some embodiments, the spacer SPC and the pixel defining layer 119 may be simultaneously formed of the same material by using a halftone mask.

A first emission layer 122 and a second emission layer 122' that are disposed in areas correspond to the first pixel electrode 121 and the second pixel electrode 121' are respectively arranged in the first opening OP1 and the second opening OP2 of the pixel defining layer 119. The first emission layer 122 and the second emission layer 122' may include a high molecular weight material or a low molecular weight material, and may be configured to emit red light, green light, blue light, or white light.

A first common layer (not illustrated) and/or a second common layer (not illustrated) may be disposed below and above the first emission layer 122 and the second emission layer 122', respectively. The first common layer is disposed below the first emission layer 222, and may include, for example, a hole transport layer (HTL) or may include an HTL and a hole injection layer (HIL). The second common layer is disposed above the first emission layer 122 and the second emission layer 122', and may include an electron transport layer (ETL) and/or an electron injection layer (EIL). In some embodiments, the second common layer may not be provided.

The first emission layer 122 and the second emission layer 122' are arranged for each pixel to correspond to the first and second openings OP1 and OP2 of the pixel defining layer 119, and the first common layer and the second common layer may be a common layer provided as one body to completely cover the first and second display areas DA1 and DA2 of the substrate 100, similarly to the opposite electrode 123 to be described below.

The opposite electrode 123 is disposed on the first emission layer 122 and the second emission layer 122'. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), or any alloy thereof. Alternatively, the opposite electrode 123 may further include a layer such as ITO, IZO, ZnO, or $In_2O_3$ disposed on the (semi)transparent layer including the above-described material. The opposite electrode 123 may be provided as one body to correspond to the first and second organic light-emitting diodes OLED and OLED' included in the first and second display areas DA1 and DA2.

The layers from the first pixel electrode 121 to the opposite electrode 123 in the first display area DA1 may constitute the first organic light-emitting diode OLED. The layers from the second pixel electrode 121' to the opposite electrode 123 in the second display area DA2 may constitute the second organic light-emitting diode OLED'.

An upper layer (not illustrated) including an organic material may be disposed on the opposite electrode 123. The upper layer may be disposed between the opposite electrode 123 and the thin-film encapsulation layer TFEL. The upper layer may be provided to protect the opposite electrode 123 and increase light extraction efficiency. The upper layer may include an organic material having a refractive index higher than that of the opposite electrode 123. The upper layer may further include LiF. Alternatively, the upper layer may further include an inorganic insulating material such as silicon oxide ($SiO_2$) or silicon nitride ($SiN_x$).

The thin-film encapsulation layer TFEL may be disposed on the opposite electrode 123, and the first and second organic light-emitting diodes OLED and OLED' may be sealed by the thin-film encapsulation layer TFEL. The thin-film encapsulation layer TFEL may prevent infiltration of ambient moisture or foreign material into the first and second organic light-emitting diodes OLED and OLED'.

The thin-film encapsulation layer TFEL may include at least one inorganic encapsulation layer and at least one organic encapsulation layer. In this regard, FIG. 5 illustrates the thin-film encapsulation layer TFEL having a structure in which a first inorganic encapsulation layer 131, an organic encapsulation layer 132, and a second inorganic encapsulation layer 133 are stacked. In another embodiment, the number of organic encapsulation layers, the number of inorganic encapsulation layers, and the stacking order may be changed.

The first inorganic encapsulation layer 131 and the second inorganic encapsulation layer 133 may include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO), and may be formed by CVD or the like. The organic encapsulation layer 132 may include a polymer-based material. The polymer-based material may include a silicone-based resin, an acrylic resin, an epoxy-based resin, polyimide, and polyethylene. The first inorganic encapsulation layer 131, the organic encapsulation layer 132, and the second inorganic encapsulation layer 133 may be provided as one body to cover the first display area DA1 and the second display area DA2.

Although FIG. 6 illustrates a case in which the second pixel circuit PCt is arranged in the peripheral area DPA, the second pixel circuit PCt may be arranged in the third display area DA3, as described above with reference to FIGS. 4 and 5.

In the present embodiment, the center of the first emission layer 122 of the first organic light-emitting diode OLED and the center of the first opening OP1 disposed in the pixel defining layer 119 may substantially coincide with each other in a plan view, and the center of the second emission layer 122' of the second organic light-emitting diode OLED' and the center of the second opening OP2 may be space apart from each other in a plan view.

That is, the center of the second emission layer 122' of the second organic light-emitting diode OLED' and the center of the emission area, that is defined by the second opening, may be spaced apart from each other in a plan view. Alternatively, the vertical distance between one end of the second emission layer 122' and a center line of the second opening may be different from the vertical distance between the other end of the second emission layer 122', which opposes the one end of the second emission layer 122', and a first center line CL1 of the second opening.

FIG. 6 illustrates that the first center line CL1 perpendicular to the upper surface of the substrate 100 at the center of the second opening and a second center line CL2 perpendicular to the upper surface of the substrate 100 at the center of the second emission layer 122' are spaced apart from each other with a distance d.

This may be a structure for implementing a random arrangement of the second pixels Pa in the second display area DA2 and securing favorable conditions for a process. Details thereof will be described below.

Figure 7A:
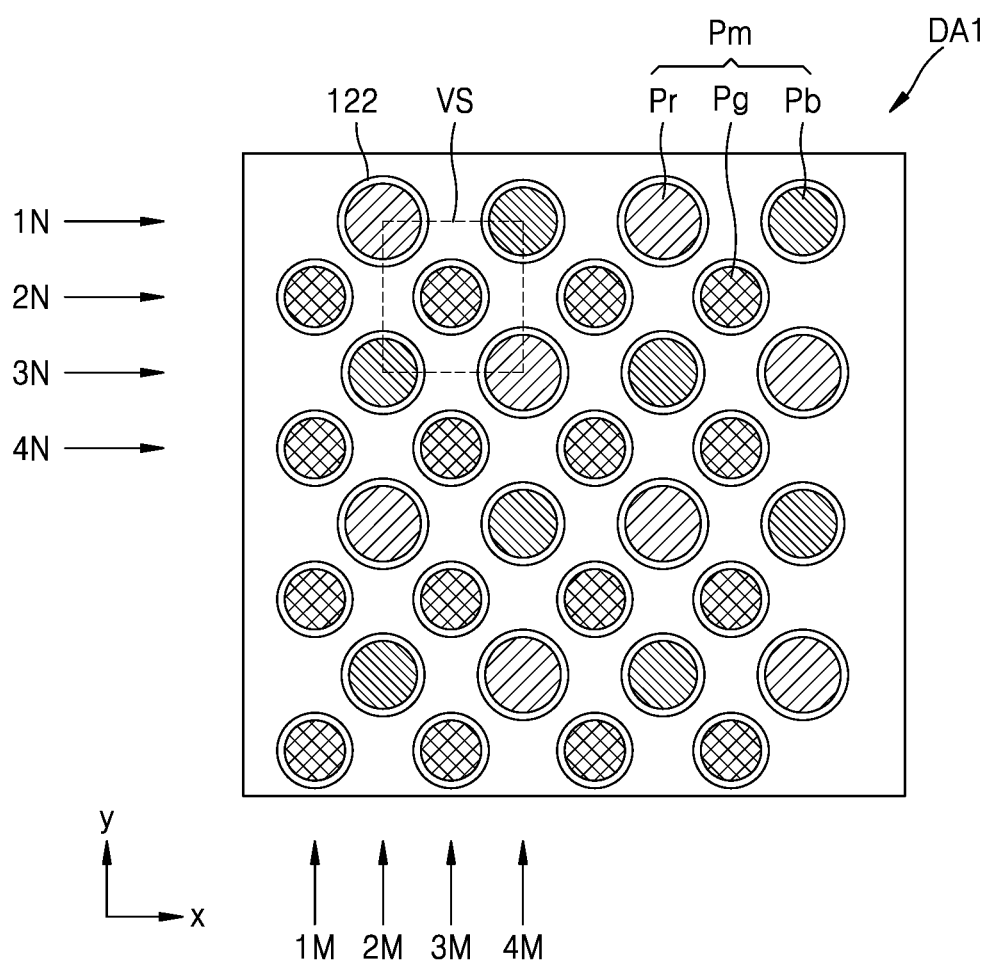
FIGS. 7A and 7B are plan views illustrating a portion of a first display area in a display panel according to an embodiment.
Figure 7B:
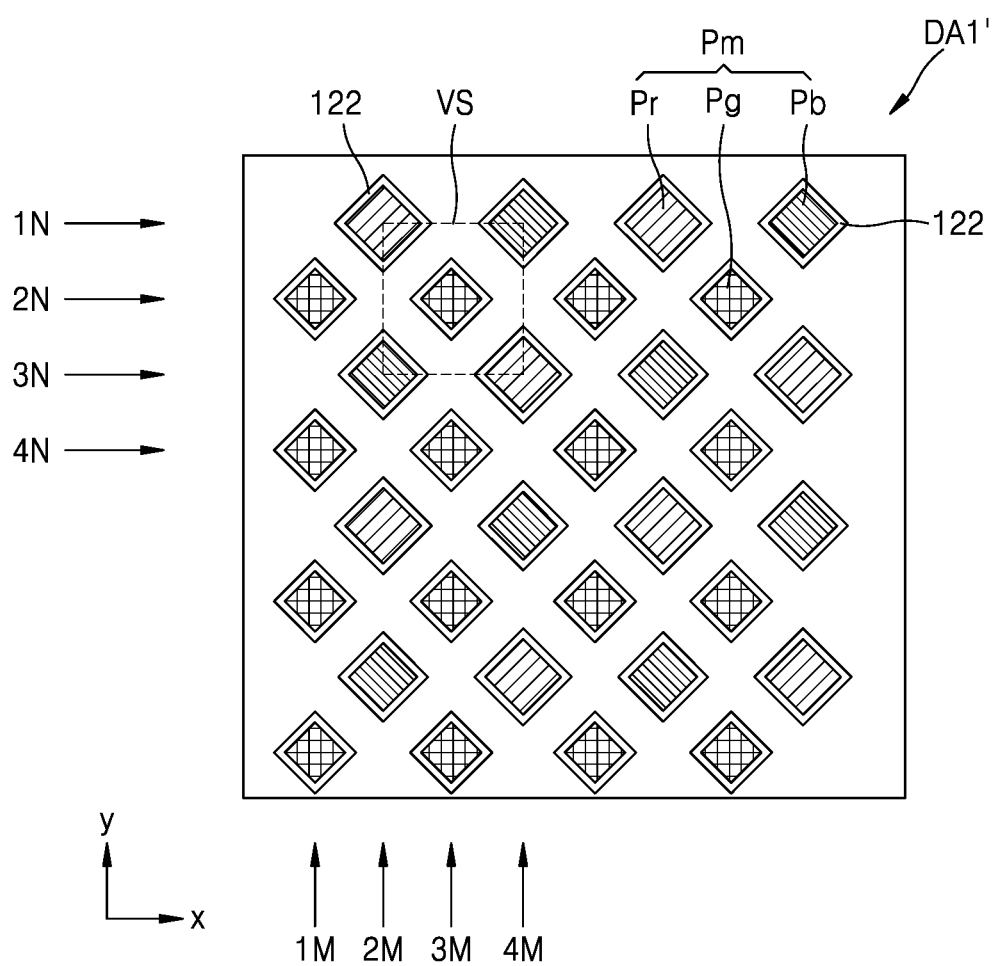

FIGS. 7A and 7B are plan views illustrating a portion of a first display area DA1 in a display panel according to an embodiment.

Referring to FIGS. 7A and 7B, first pixels Pm may be arranged in the first display area DA1 and the first pixels Pm may include (1-1)th to (1-3)th pixels that emit light of different colors from each other. The first pixels Pm may refer to emission areas of first organic light-emitting diodes arranged in the first display area DA1.

Hereinafter, for convenience of explanation, it is assumed that the (1-1)th pixel is a red pixel Pr, the (1-2)th pixel is a green pixel Pg, and the (1-3)th pixel is a blue pixel Pb.

The red pixel Pr, the green pixel Pg, and the blue pixel Pb may be arranged in the first display area DA1 according to a certain rule. In some embodiments, as illustrated in FIGS. 7A and 7B, the red pixel Pr, the green pixel Pg, and the blue pixel Pb may be arranged in a diamond PenTile™ type.

For example, a plurality of red pixels Pr and a plurality of blue pixels Pb are alternately arranged in a first row 1N, a plurality of green pixels Pg are arranged at certain intervals in a second row 2N adjacent to the first row 1N, blue pixels Pb and red pixels Pr are alternately arranged in a third row 3N adjacent to the second row 2N, and a plurality of green pixels Pg are arranged at certain intervals in a fourth row 4N adjacent to the third row 3N. Such a pixel arrangement is repeated up to an $N^{th}$ row. In this case, the size (or width) of the blue pixel Pb and the red pixel Pr may be greater than the size (or width) of the green pixel Pg. In this case, the centers of the pixels in the first to $N^{th}$ rows may be arranged in a line extending along each row.

The red pixels Pr and the blue pixels Pb in the first row 1N and the green pixels Pg in the second row 2N are alternately arranged along a column direction. Therefore, the green pixels Pg are arranged at certain intervals in a first column 1M, the red pixels Pr and the blue pixels Pb are alternately arranged in a second column 2M disposed adjacent to the first column 1M, the green pixels Pg are arranged at certain intervals in a third column 3M disposed adjacent to the second column 2M, and the blue pixels Pb and the red pixels Pr are alternately arranged in a fourth column 4M disposed adjacent to the third column 3M. Such a pixel arrangement is repeated up to an $M^{th}$ column. In this case, the centers of the pixels in the first to $M^{th}$ columns may be arranged in a line extending along each column.

Such a pixel arrangement structure may be expressed as follows: the red pixels Pr are arranged at first and third vertices facing each other among vertices of a virtual quadrangle with the center point of the green pixel Pg as the center point of the quadrangle, and the blue pixels Pb are arranged at the remaining vertices, that is, second and fourth vertices. In this case, the center points of the red pixels Pr and the blue pixels Pb may be arranged at the vertices of the virtual quadrangle VS. The virtual quadrangle VS may be variously modified. For example, the virtual quadrangle VS may have a rectangular shape, a diamond shape, and a square shape.

Such a pixel arrangement structure is called a diamond PenTile™ type, and high resolution may be implemented with a small number of pixels by applying rendering driving of expressing colors by sharing neighboring pixels. As described above, in the present embodiment, the pixels in the first display area DA1 are regularly arranged.

On the other hand, although the red pixels Pr, the green pixels Pg, and the blue pixels Pb illustrated in FIGS. 7A and 7B are arranged in a diamond PenTile™ structure, the disclosure is not limited thereto. The red pixels Pr, the green pixels Pg, and the blue pixels Pb may be arranged in various regular arrangements, for example, a stripe arrangement and a mosaic arrangement.

Also, FIG. 7A illustrates that the red pixels Pr, the green pixels Pg, and the blue pixels Pb have a circular shape, the red pixels Pr, the green pixels Pg, and the blue pixels Pb may have a rectangular shape, as illustrated in FIG. 7B. Alternatively, the red pixels Pr, the green pixels Pg, and the blue pixels Pb may have various shapes, for example, a polygonal shape such as an elliptical shape or a hexagonal shape, a polygonal shape with round corners, etc.

The red pixels Pr, the green pixels Pg, and the blue pixels Pb illustrated in FIGS. 7A and 7B may emit red light, green light, and blue light by using organic light-emitting diodes arranged in the corresponding pixels. Therefore, the arrangement of the pixels may correspond to the arrangement of the emission areas of the organic light-emitting diodes that are display elements. For example, the position of the red pixels Pr illustrated in FIGS. 7A and 7B may indicate the positions of the emission areas of the organic light-emitting diodes that emit red light. Similarly, the position of the green pixels Pg may indicate the positions of the emission areas of the organic light-emitting diodes that emit green light, and the positions of the blue pixels Pb may indicate the positions of the emission areas of the organic light-emitting diodes that emit blue light.

FIGS. 7A and 7B illustrate the first emission layers 122 of the organic light-emitting diodes. The size of the first emission layers 122 may be greater than the size of the pixels (the emission areas) in a plan view, and the centers of the first emission layers 122 may be arranged to substantially coincide with the centers of the pixels in a plan view. That is, the centers of the emission areas of the organic light-emitting diode in a plan view may be substantially the same as the centers of the first emission layers 122. The centers of the first emission layers 122 may be arranged in a line along the rows and the columns.

Figure 8:
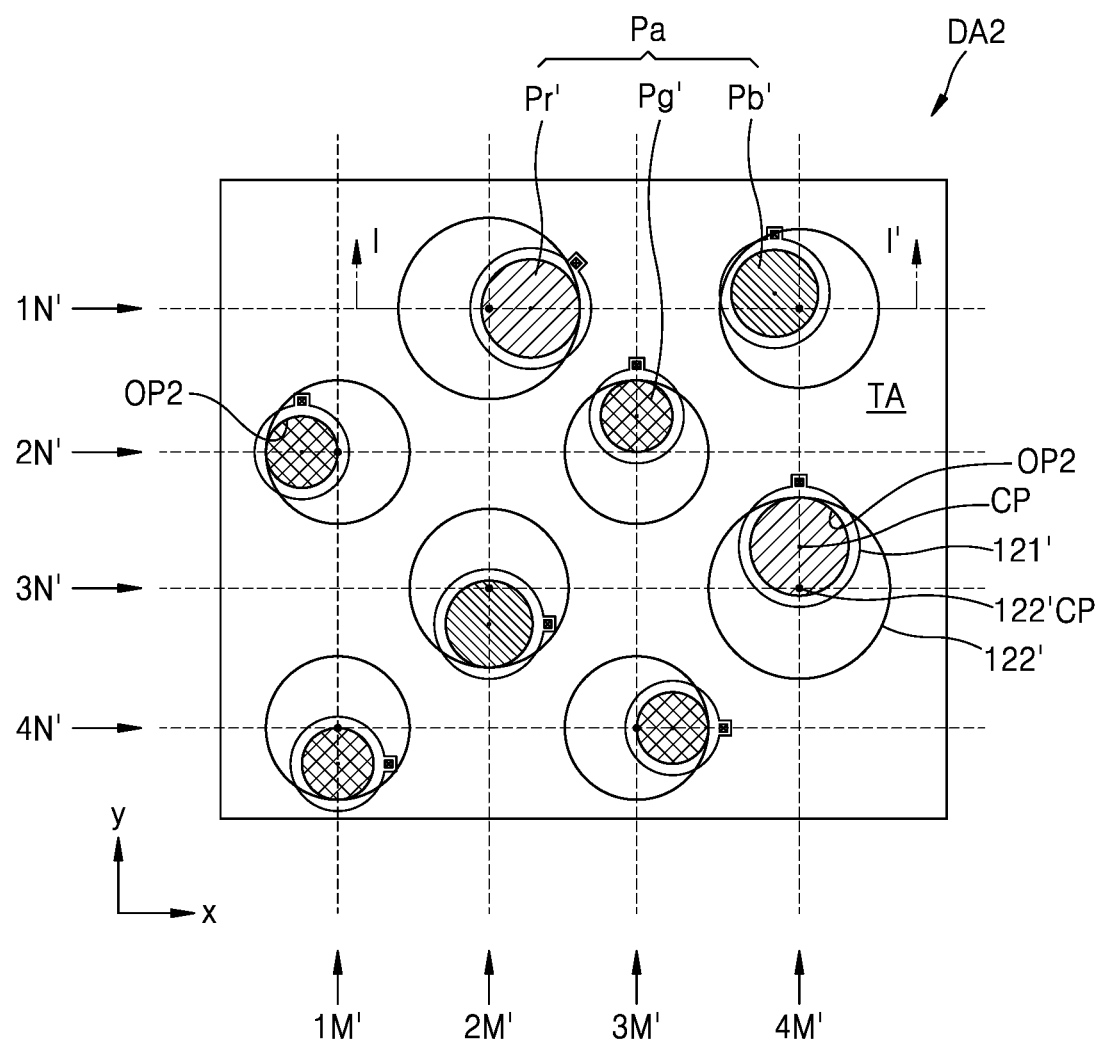
FIG. 8 is a plan view illustrating a portion of a second display area in a display panel according to an embodiment.

FIG. 8 is a plan view illustrating a portion of a second display area DA2 in a display panel, according to an embodiment.

Referring to FIG. 8, second pixels Pa may be arranged in the second display area DA2, and the second pixels Pa may include (2-1)th to (2-3)th pixels that emit light of different colors from each other. The second pixels Pa may refer to emission areas of second organic light-emitting diodes arranged in the second display area DA2.

Hereinafter, for convenience of explanation, it is assumed that the (2-1)th pixel is a red pixel Pr', the (2-2)th pixel is a green pixel Pg', and the (2-3)th pixel is a blue pixel Pb'.

The red pixel Pr', the green pixel Pg', and the blue pixel Pb' may be irregularly arranged in the second display area DA2. In this specification, the irregular arrangement means that the centers CP of the red pixel Pr', the green pixel Pg', and the blue pixel Pb' are not arranged on an imaginary straight line which passes through centers of emission layers, but some of the centers CP of the red pixel Pr', the green pixel Pg', and the blue pixel Pb' are arranged in regions deviated from the imaginary straight line which passes through centers of emission layers. The center CP may refer to the center of gravity of a projected plane when each pixel is projected on a plane with respect to the upper surface of the substrate 100.

For example, a plurality of red pixels Pr' and a plurality of blue pixels Pb' are alternately arranged in a first row 1N' of the second display area DA2, and a plurality of green pixels Pg' may be spaced apart from each other in a second row 2N' disposed adjacent to the first row 1N'. A plurality of blue pixels Pb' and a plurality of red pixels Pr' are alternately arranged in a third row 3N' disposed adjacent to the second row 2N', and a plurality of green pixels Pg are spaced apart from each other in a fourth row 4N' disposed adjacent to the third row 3N'. Such a pixel arrangement is repeated up to an $N^{\prime th}$ row.

Also, the green pixels Pg' are arranged at a certain interval in a first column 1M' of the second display area DA2, the red pixels Pr' and the blue pixels Pb' are alternately arranged in a second column 2M' disposed adjacent to the first column 1M', the green pixels Pg' are arranged at a certain interval in a third column 3M' disposed adjacent to the second column 2M', and the blue pixels Pb' and the red pixels Pr' are alternately arranged in a fourth column 4M' disposed adjacent to the third column 3M'. Such a pixel arrangement is repeated up to an $M^{\prime th}$ column.

However, some of the centers CPs of the second pixels in the respective row may not be arranged on a straight line which passes through centers of emission layers disposed in the respective row, but may be arranged in regions deviated from the straight line which passes through centers of emission layers disposed in the respective row. Similarly, the centers CPs of the pixels in the respective columns may not be arranged on a straight line which passes through centers of emission layers disposed in the respective column, but may be arranged in regions deviated from the straight line which passes through centers of emission layers disposed in the respective column. That is, the centers CPs of the second pixels may not be arranged on intersections of the straight lines which pass through centers of emission layers disposed in rows and the straight lines which pass through centers of emission layers disposed in columns.

On the other hand, second emission layers 122' in the second display area DA2 may be regularly arranged. Centers 122'CP of the second emission layers 122' may be arranged on a straight line which passes through centers of the second emission layers 122' disposed in the respective row. Also, the centers 122'CP of the second emission layers 122' may be arranged on a straight line which passes through centers of the second emission layers 122' disposed in the respective column. The second emission layers 122' may be disposed at the intersections of the straight lines which pass through centers of the second emission layers 122' disposed in the rows and the straight lines which pass through centers of the second emission layers 122' disposed in the columns. For example, the second emission layer 122' implementing the red pixel Pr' may be at the intersection of the straight line which passes through centers of the emission layers 122' in the first row 1N' and the straight line which passes through centers of the emission layers 122' in the second column 2M'. The second emission layer 122' implementing the green pixel Pg' may be at the intersection of the straight line which passes through centers of the emission layers 122' in the second row 2N' and the straight line which passes through centers of the emission layers 122' in the first column 1M'.

The second emission layers 122' may be deposited through a fine metal mask (FMM). In this case, it may be advantageous in terms of process to regularly arrange the second emission layers 122'.

On the other hand, when the second display elements in the second display area DA2 have a regular arrangement, the transmission area TA in the second display area DA2 may also have a regular arrangement. Therefore, a flare phenomenon may occur due to diffraction of light passing through the transmission area TA. The flare phenomenon may be minimized or reduced by the irregular arrangement of the transmission area TA.

In the present embodiment, in order to minimize the flare phenomenon, the second openings OP2 and the second pixel electrode 121' of the second organic light-emitting diodes, which are the second display elements, are irregularly arranged.

The transmission area TA in the second display area DA2 may be an area in which the second pixel electrodes 121' are not arranged. That is, a partial area of the second emission layer 122' and an area of the second emission layer 122 ' that does not overlap the second pixel electrode 121' may also be the transmission area TA. Therefore, even though the second emission layers 122' are regularly arranged, the positions of the second pixel electrodes 121' are irregularly arranged, so that the transmission area TA may have an irregular arrangement.

The planar shape of the second pixel electrode 121' is similar to the planar shape of the second opening OP2 that defines the emission area, but the second pixel electrode 121' may be connected to a conductive layer of another layer, for example, the connection line TWL, through a contact hole. Because the second opening OP2 are disposed in an area corresponds to the central portion of the second pixel electrode 121', the size of the second opening OP2 may be less than the size of the second pixel electrode 121'.

A partial area of the second emission layer 122' may include an area that does not overlap the second pixel electrode 121', and the area may be the transmission area through which light passes. The second emission layer 122' may cover a partial edge of the second pixel electrode 121', and the edge of the second emission layer 122' may be dispose not to overlap the second pixel electrode 121' in a plan view.

Figure 9:
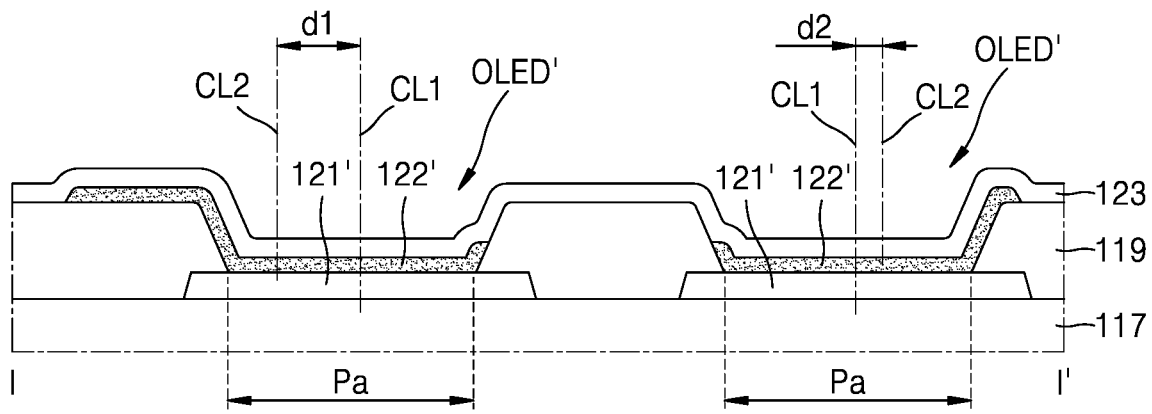
FIG. 9 is a schematic cross-sectional view of a portion of a display panel taken along line I-I' of FIG. 8 according to an embodiment.

FIG. 9 is a schematic cross-sectional view of a portion of a display panel taken along line I-I' of FIG. 8 according to an embodiment.

Referring to FIG. 9, a plurality of second organic light-emitting diodes OLED' may be arranged in a second display area DA2. Each of the second organic light-emitting diodes OLED' may include a second pixel electrode 121' and a second emission layer 122'. An opposite electrode 123 may be provided as one body through the second organic light-emitting diodes OLED'.

In the present embodiment, a center of the second emission layer 122' of the second organic light-emitting diode OLED' may not be formed in a same position as a center of an emission area, that is, a second opening OP2, in a plan view. FIG. 9 illustrates that a first center line CL1 that extends perpendicular to an upper surface of a substrate 100 and passes through the center of the second opening OP2 and a second center line CL2 that extends perpendicular to the upper surface of the substrate 100 and passes through the center of the second emission layer 122' are spaced apart from each other with distances d1 and d2.

In some embodiments, the distances d1 and d2 between the first center line CL1 and the second center line CL2 may be different from each other for each second organic light emitting diode OLED' arranged in the second display area DA2. Also, the relative positions of the second emission layer 122' and the second opening OP2 may also be different from each other for each second organic light-emitting diode OLED'. Various modifications may be made thereto. For example, in some second organic light-emitting diodes OLED', the center of the second emission layer 122' is arranged on the right side with respect to the center of the second opening OP2, and, in other second organic light-emitting diodes OLED', the center of the second emission layer 122' is arranged on the left side with respect to the center of the second opening OP2.

FIGS. 10A to 10D are schematic plan views illustrating the positional relationships between second openings, which define emission areas, and second emission layers of second organic light-emitting diodes employable in embodiments.

Figure 10A:
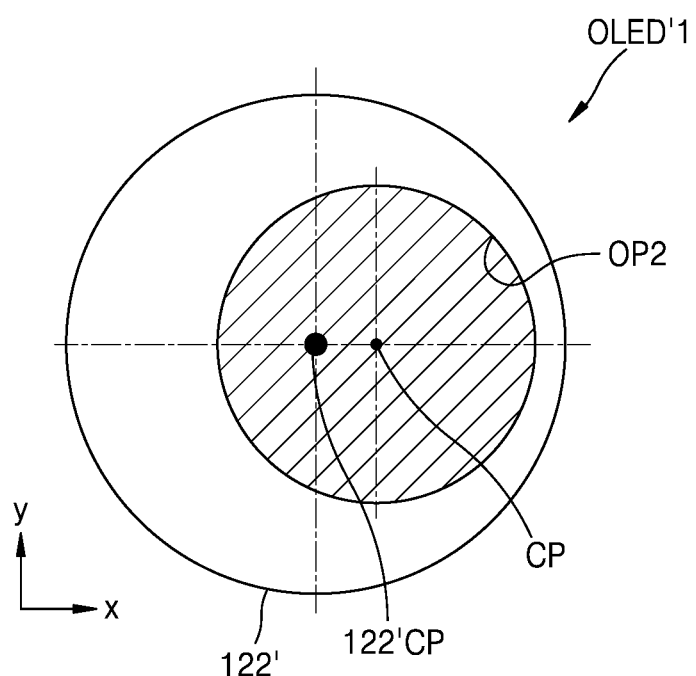
FIGS. 10A, 10B, 10C and 10D are schematic plan views illustrating the positional relationships between second openings, which are emission areas, and second emission layers of second organic light-emitting diodes employable in embodiments.

Referring to FIG. 10A, in a (2-1)th organic light-emitting diode OLED'1, a center 122'CP of an emission layer 122' and a center CP of a second opening OP2, which defines an emission area, may be spaced apart from each other in the x direction. That is, the center 122'CP of the emission layer 122' and the center CP of the second opening OP2, which defines the emission area, may be horizontally shifted.

Figure 10B:
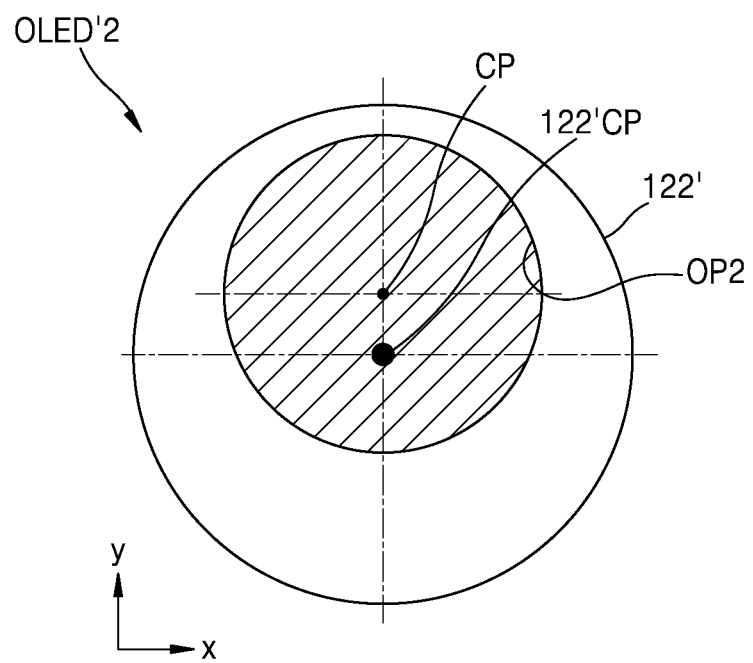

Referring to FIG. 10B, in a (2-2)th organic light-emitting diode OLED'2, a center 122'CP of an emission layer 122' and a center CP of a second opening OP2, which defines an emission area, may be spaced apart from each other in the y direction. That is, the center 122'CP of the emission layer 122' and the center CP of the second opening OP2, which defines the emission area, may be vertically shifted.

Figure 10C:
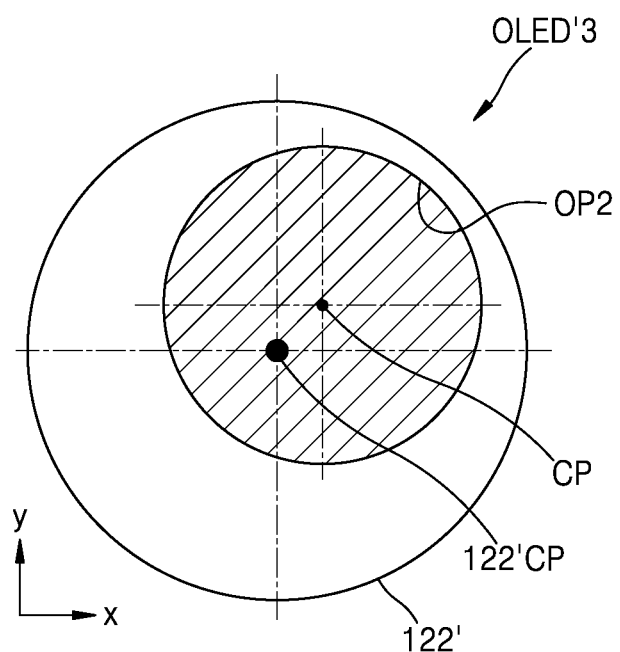

Referring to FIG. 10C, in a (2-3)th organic light-emitting diode OLED'3, a center 122'CP of an emission layer 122' and a center CP of a second opening OP2, which defines an emission area, may be spaced apart from each other in the x direction and the y direction. That is, the center 122'CP of the emission layer 122' and the center CP of the second opening OP2, which defines the emission area, may be diagonally shifted.

Figure 10D:
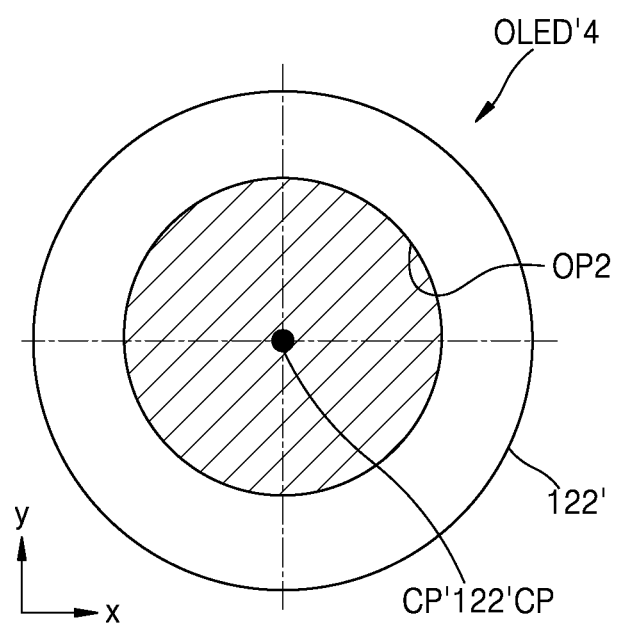

Referring to FIG. 10D, in a (2-4)th organic light-emitting diode OLED'4, a center 122'CP of the emission layer 122' and a center CP of a second opening OP2, which defines an emission area, may coincide with each other in a plan view.

The second organic light-emitting diodes in the second display area DA2 may include at least two selected from the $(2-1)^{th}$ to $(2-4)^{th}$ organic light-emitting diodes OLED'1 to OLED'4. Also, the $(2-1)^{th}$ to $(2-4)^{th}$ organic light-emitting diodes OLED'1 to OLED'4 may be randomly arranged in the second display area DA2.

Figure 11:
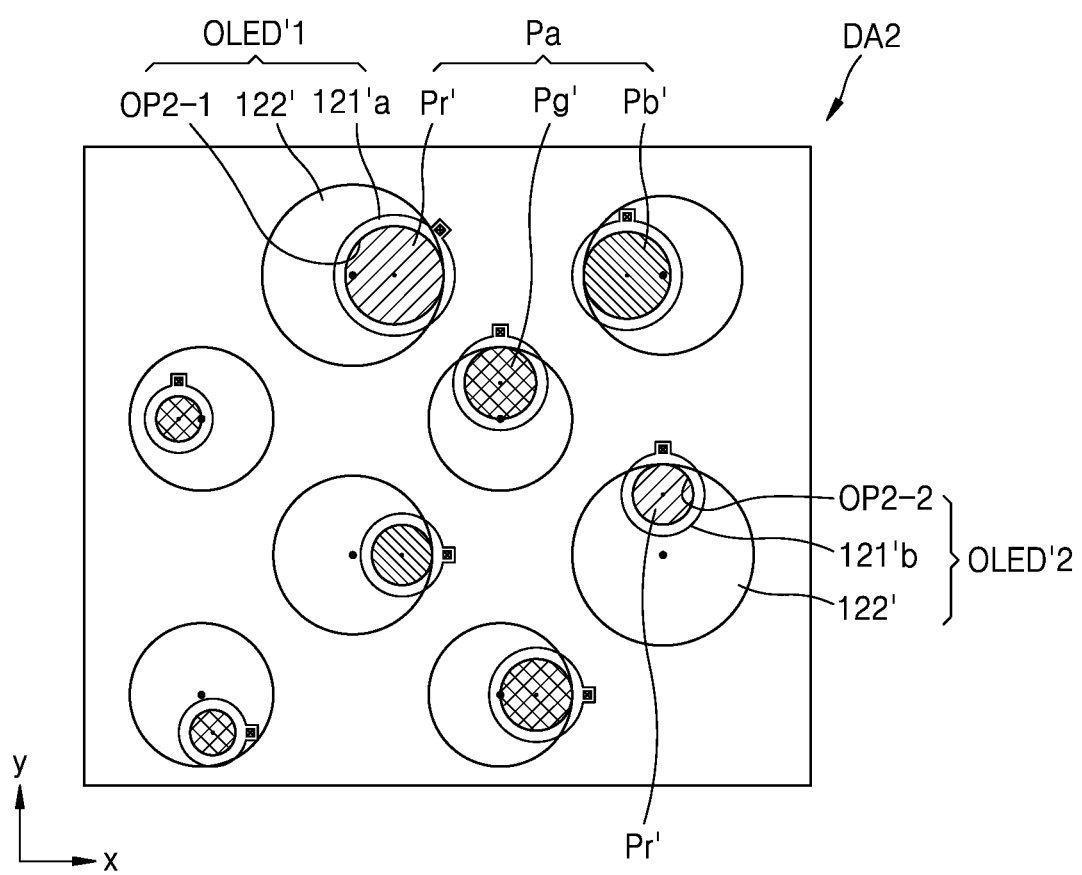
FIG. 11 is a plan view illustrating a portion of a second display area in a display panel according to an embodiment.

FIG. 11 is a plan view illustrating a portion of a second display area DA2 in a display panel according to an embodiment. In FIG. 11, the same reference numerals as those in FIG. 8 denote the same members and redundant descriptions thereof are omitted.

Referring to FIG. 11, second pixels Pa implemented as second organic light-emitting diodes OLED' may be arranged in a second display area DA2 and the second pixels Pa may include $(2-1)^{th}$ to $(2-3)^{th}$ pixels that emit light of different colors from each other. Hereinafter, for convenience of explanation, it is assumed that the $(2-1)^{th}$ pixel is a red pixel Pr', the $(2-2)^{th}$ pixel is a green pixel Pg', and the $(2-3)^{th}$ pixel is a blue pixel Pb'.

The red pixel Pr', the green pixel Pg', and the blue pixel Pb' may be irregularly arranged in the second display area DA2.

In the present embodiment, second organic light-emitting diodes OLED' may include a $(2-1)^{th}$ organic light-emitting diode OLED'1 and a (2-2)$^{th}$ organic light-emitting diode OLED'2 that emit the same color. A size of an emission area of the (2-1)$^{th}$ organic light-emitting diode OLED'1 may be different from a size of an emission area of the (2-2)$^{th}$ organic light-emitting diode OLED'2.

In some embodiments, both the (2-1)$^{th}$ organic light-emitting diode OLED'1 and the (2-2)$^{th}$ organic light-emitting diode OLED'2 may be red pixels Pr'. The red pixels Pr' implemented by the (2-1)$^{th}$ organic light-emitting diode OLED'1 and the (2-1)$^{th}$ organic light-emitting diode OLED'2 may have different sizes from each other. Also, the size of the pixel electrode 121' of the (2-1)$^{th}$ organic light-emitting diode OLED'1 may be different from the size of the pixel electrode 122' of the (2-2)$^{th}$ organic light-emitting diode OLED'2.

For example, a (2-1)$^{th}$ opening OP2-1, which defines the emission area of the (2-1)$^{th}$ organic light-emitting diode OLED'1, may be greater than a (2-2)$^{th}$ opening OP2-2, which defines the emission area of the (2-2)$^{th}$ organic light-emitting diode OLED'2. Also, the size of the pixel electrode 121' of the (2-1)$^{th}$ organic light-emitting diode OLED'1 may be greater than the size of the pixel electrode 122' of the (2-2)$^{th}$ organic light-emitting diode OLED'2.

Similarly, blue pixels Pb' arranged in the second display area DA2 may have various sizes, and green pixels Pg' arranged in the second display area DA2 may also have various sizes.

Figure 12:
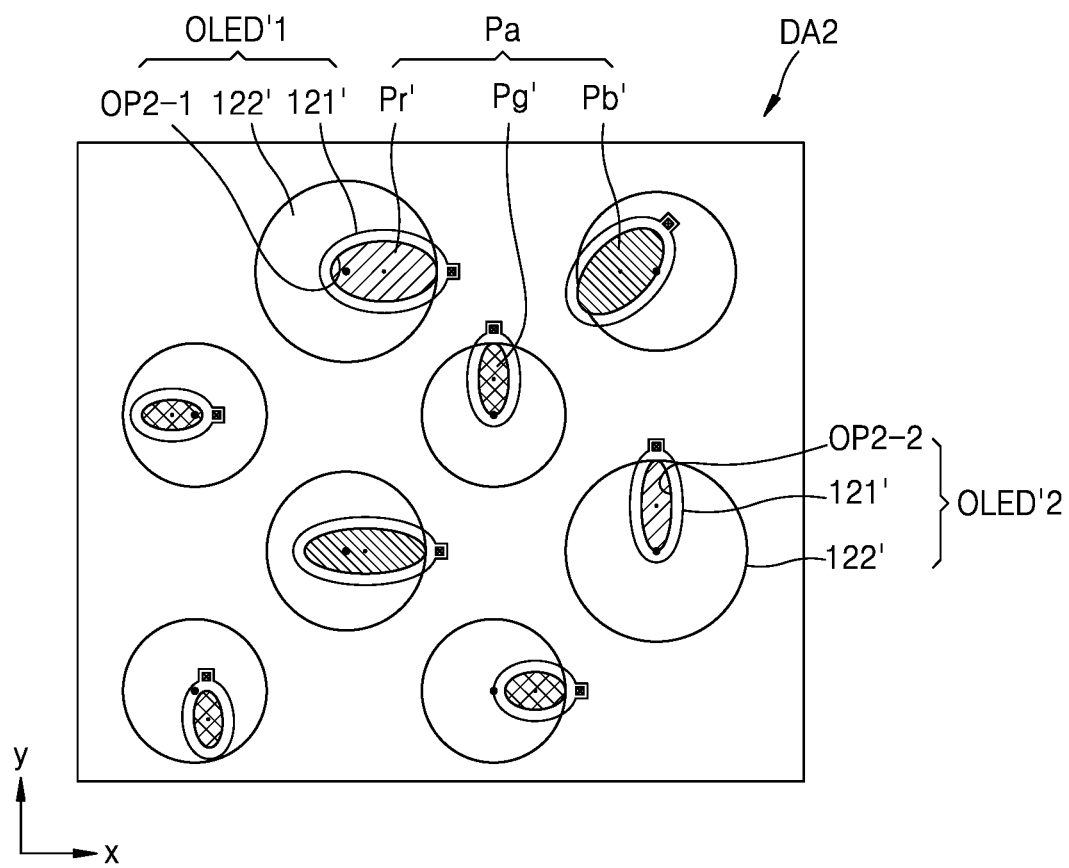
FIG. 12 is a plan view illustrating a portion of a second display area in a display panel according to an embodiment.

FIG. 12 is a plan view illustrating a portion of a second display area DA in a display panel according to an embodiment. In FIG. 12, the same reference numerals as those in FIG. 8 denote the same members, and redundant descriptions thereof are omitted.

Referring to FIG. 12, second pixels Pa implemented as second organic light-emitting diodes OLED' may be arranged in a second display area DA2 and the second pixels Pa may include (2-1)$^{th}$ to (2-3)$^{th}$ pixels that emit light of different colors from each other. Hereinafter, for convenience of explanation, it is assumed that the (2-1)$^{th}$ pixel is a red pixel Pr', the (2-2)$^{th}$ pixel is a green pixel Pg', and the (2-3)$^{th}$ pixel is a blue pixel Pb'.

The red pixel Pr', the green pixel Pg', and the blue pixel Pb' may be irregularly arranged in the second display area DA2.

In the present embodiment, second organic light-emitting diodes OLED' may include a (2-1)$^{th}$ organic light-emitting diode OLED'1 and a (2-2)$^{th}$ organic light-emitting diode OLED'2. A shape of an emission area of the (2-1)$^{th}$ organic light-emitting diode OLED'1 may be different from a shape of an emission area of the (2-2)$^{th}$ organic light-emitting diode OLED'2.

In some embodiments, both the (2-1)$^{th}$ organic light-emitting diode OLED'1 and the (2-2)$^{th}$ organic light-emitting diode OLED'2 may be red pixels Pr'. The red pixels Pr' implemented by the (2-1)$^{th}$ organic light-emitting diode OLED'1 and the (2-1)$^{th}$ organic light-emitting diode OLED'2 may have different shapes from each other. Also, a shape of a pixel electrode 121' of the (2-1)$^{th}$ organic light-emitting diode OLED'1 may be different from a shape of a pixel electrode 122' of the (2-2)$^{th}$ organic light-emitting diode OLED'2.

For example, a (2-1)$^{th}$ opening OP2-1, which defines the emission area of the (2-1)$^{th}$ organic light-emitting diode OLED'1, and a (2-2)$^{th}$ opening OP2-2, which defines the emission area of the (2-2)$^{th}$ organic light-emitting diode OLED'2, may have elliptical shapes having different eccentricities from each other. Alternatively, the (2-1)$^{th}$ opening OP2-1, which defines the emission area of the (2-1)$^{th}$ organic light-emitting diode OLED'1, may have a circular shape, and the (2-2)-$^{th}$ opening OP2-2, which defines the emission area of the (2-2)$^{th}$ organic light-emitting diode OLED'2, may have an elliptical shape. Alternatively, the (2-1)$^{th}$ opening OP2-1, which defines the emission area of the (2-1)$^{th}$ organic light-emitting diode OLED'1, may have a circular shape, and the (2-2)$^{th}$ opening OP2-2, which defines the emission area of the (2-2)$^{th}$ organic light-emitting diode OLED'2, may have a polygonal shape.

Similarly, blue pixels Pb' arranged in the second display area DA2 may have various shapes, and green pixels Pg' arranged in the second display area DA2 may also have various shapes.

Figure 13:
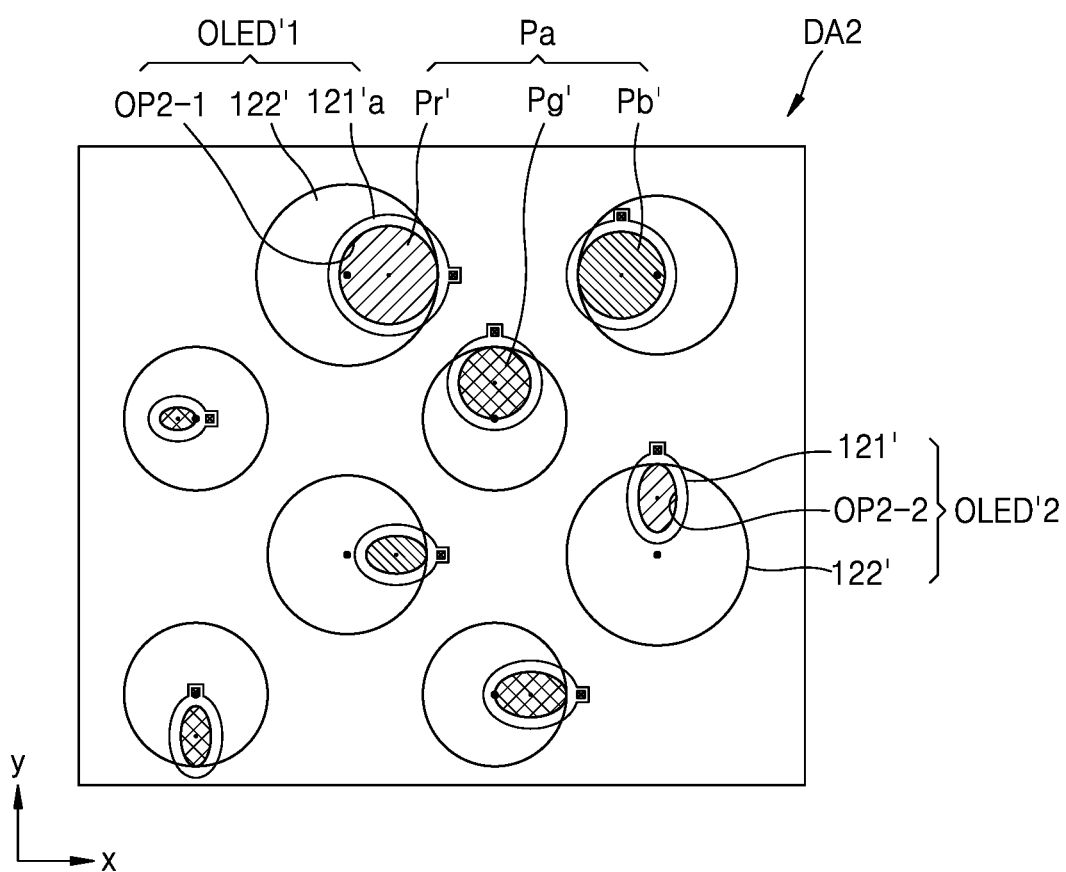
FIG. 13 is a plan view illustrating a portion of a second display area in a display panel according to an embodiment.

FIG. 13 is a plan view illustrating a portion of a second display area DA2 in a display panel according to an embodiment. In FIG. 13, the same reference numerals as those in FIG. 8 denote the same members, and redundant descriptions thereof are omitted.

Referring to FIG. 13, second pixels Pa implemented as second organic light-emitting diodes OLED' may be arranged in a second display area DA2 and the second pixels Pa may include (2-1)$^{th}$ to (2-3)$^{th}$ pixels that emit light of different colors from each other. Hereinafter, for convenience of explanation, it is assumed that the (2-1)$^{th}$ pixel is a red pixel Pr', the (2-2)$^{th}$ pixel is a green pixel Pg', and the (2-3)$^{th}$ pixel is a blue pixel Pb'.

The red pixel Pr', the green pixel Pg', and the blue pixel Pb' may be irregularly arranged in the second display area DA2.

In the present embodiment, second organic light-emitting diodes OLED' may include a (2-1)$^{th}$ organic light-emitting diode OLED'1 and a (2-2)$^{th}$ organic light-emitting diode OLED'2. The size and shape of an emission area of the (2-1)$^{th}$ organic light-emitting diode OLED'1 may be different from the size and shape of an emission area of the (2-2)$^{th}$ organic light-emitting diode OLED'2.

In some embodiments, both the (2-1)$^{th}$ organic light-emitting diode OLED'1 and the (2-2)$^{th}$ organic light-emitting diode OLED'2 may be red pixels Pr'. The red pixels Pr' implemented by the (2-1)$^{th}$ organic light-emitting diode OLED'1 and the (2-2)$^{th}$ organic light-emitting diode OLED'2 may have different sizes and shapes from each other. Also, the size and shape of a pixel electrode 121' of the (2-1)$^{th}$ organic light-emitting diode OLED'1 may be different from the size and shape of a pixel electrode 122' of the (2-2)$^{th}$ organic light-emitting diode OLED'2.

For example, a (2-1)$^{th}$ opening OP2-1, which defines the emission area of the (2-1)$^{th}$ organic light-emitting diode OLED'1, may be greater than a (2-2)$^{th}$ opening OP2-2, which defines the emission area of the (2-2)$^{th}$ organic light-emitting diode OLED'2. Also, the (2-1)$^{th}$ opening OP2-1, which defines the emission area of the (2-1)$^{th}$ organic light-emitting diode OLED'1, may have a circular shape, and the (2-2)$^{th}$ opening OP2-2, which defines the emission area of the (2-2)$^{th}$ organic light-emitting diode OLED'2, may have an elliptical shape.

Similarly, blue pixels Pb' arranged in the second display area DA2 may have various sizes and shapes, and green pixels Pg' arranged in the second display area DA2 may also have various sizes and shapes.

As described above, in the display panel and the device apparatus according to the embodiments, because the second display elements are irregularly arranged in the second display area, the light diffraction phenomenon in the second display area may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate comprising a first display area and a second display area including a transmission area;
a plurality of first display elements arranged in the first display area;
a plurality of second display elements arranged in the second display area, the plurality of second display elements each comprising a pixel electrode and an emission layer; and
a pixel defining layer defining an emission area by an opening exposing a central portion of the pixel electrode of each of the plurality of second display elements,
wherein, in at least one of the plurality of second display elements, a first center of the emission layer and a second center of the emission area do not coincide with each other in a plan view,
wherein the plurality of second display elements comprise a (2-1)th display element and a (2-2)th display element that emit a same color,
wherein an emission area of the (2-1)th display element and an emission area of the (2-2)th display element is a same shape, and
wherein a size of the emission area of the (2-1)th display element is different from a size of the emission area of the (2-2)th display element.

2. The display panel of claim 1, wherein emission areas of the plurality of first display elements are regularly arranged and the emission areas of the plurality of second display elements are irregularly arranged.

3. The display panel of claim 1, wherein the emission layer has a portion that does not overlap the pixel electrode in a plan view.

4. A display panel comprising:
a substrate comprising a first display area and a second display area including a transmission area;
a plurality of first display elements arranged in the first display area;
a plurality of second display elements arranged in the second display area, the plurality of second display elements each comprising a pixel electrode and an emission layer; and
a pixel defining layer defining an emission area by an opening exposing a central portion of the pixel electrode of each of the plurality of second display elements,
wherein, in at least one of the plurality of second display elements, a first center of the emission layer and a second center of the emission area do not coincide with each other in a plan view, and
wherein the plurality of second display elements comprise:
a (2-1)th display element in which the first center and the second center are horizontally shifted in a plan view; and a (2-2)th display element in which the first center and the second center are vertically shifted in a plan view and disposed on a line extending vertically.

5. The display panel of claim 1, wherein the (2-1)th display element and the (2-2)th display element have elliptical shapes having different eccentricities from each other.

6. The display panel of claim 1, wherein the plurality of second display elements comprise the (2-1)th display element and the (2-2)th display element that have different sizes from each other.

7. The display panel of claim 1, wherein a center of an emission layer and a center of an emission area in each of the plurality of first display elements coincide with each other in a plan view.

8. The display panel of claim 4, wherein the plurality of second display elements further comprise:
a (2-3)th display element in which the first center and the second center are diagonally shifted in a plan view; and
a (2-4)th display element in which the first center and the second center coincide with each other in a plan view, and
wherein the (2-1)th display element, the (2-2)th display element, the (2-3)th display element, and the (2-4)th display element are randomly arranged.

9. A display apparatus comprising:
a display panel comprising a first display area and a second display area in which a transmission area is arranged; and
a component disposed below the display panel and overlapping the second display area,
wherein the display panel comprises:
a substrate;
a plurality of first display elements arranged in the first display area;
a plurality of second display elements arranged in the second display area, the plurality of second display elements each comprising a pixel electrode and an emission layer; and
a pixel defining layer defining an emission area by an opening exposing a central portion of the pixel electrode of each of the plurality of second display elements,
wherein, in at least one of the plurality of second display elements, a first center that is a center of the emission area and a second center that is a center of the emission layer do not coincide with each other in a plan view,
wherein the plurality of second display elements comprise a (2-1)th display element and a (2-2)th display element that emit a same color,
wherein an emission area of the (2-1)th display element and an emission area of the (2-2)th display element is a same shape, and
wherein a size of the emission area of the (2-1)th display element is different from a size of the emission area of the (2-2)th display element.

10. The display apparatus of claim 9, wherein emission areas of the plurality of first display elements are regularly arranged and emission areas of the plurality of second display elements are irregularly arranged.

11. The display apparatus of claim 9, wherein the emission layer has a portion that does not overlap the pixel electrode in a plan view.

12. The display apparatus of claim 9, wherein the plurality of second display elements comprise at least two selected from:
- the (2-1)th display element in which the first center and the second center are horizontally shifted in a plan view;
- the (2-2)th display element in which the first center and the second center are vertically shifted in a plan view;
- a (2-3)th display element in which the first center and the second center are diagonally shifted in a plan view; and
- a (2-4)th display element in which the first center and the second center coincide with each other in a plan view.

13. The display apparatus of claim 12, wherein the (2-1)th display element, the (2-2)th display element, the (2-3)th display element, and the (2-4)th display element are randomly arranged.

14. The display apparatus of claim 9, wherein the (2-1)th display element and the (2-2)th display element have elliptical shapes having different eccentricities from each other.

15. The display apparatus of claim 9, wherein a center of an emission layer and a center of an emission area in each of the plurality of first display elements coincide with each other in a plan view.

16. The display panel of claim 1, wherein the plurality of second display elements include a plurality of pixels each including a first subpixel emitting a first color of light, a second subpixel emitting a second color of light and a third subpixel emitting a third color of light, and
wherein shifted directions of the first subpixel, the second subpixel and the third subpixel are different from each other.

17. The display apparatus of claim 9, wherein the plurality of second display elements include a plurality of pixels each including a first subpixel emitting a first color of light, a second subpixel emitting a second color of light and a third subpixel emitting a third color of light, and
wherein shifted directions of the first subpixel, the second subpixel and the third subpixel are different from each other.

* * * * *